United States Patent
Sato et al.

(10) Patent No.: US 7,150,925 B2
(45) Date of Patent: Dec. 19, 2006

(54) SURFACE COATED CEMENTED CARBIDE CUTTING TOOL HAVING HARD COATING LAYER EXHIBITING EXCELLENT WEAR RESISTANCE IN HIGH SPEED MACHINING

(75) Inventors: Kazunori Sato, Kakogawa (JP); Akihiro Kondo, Kakogawa (JP); Yusuke Tanaka, Akashi (JP); Yasuhiko Tashiro, Tsukuba (JP); Eiji Nakamura, Naka-gun (JP); Hidemitsu Takaoka, Naka-gun (JP)

(73) Assignees: Mitsubishi Materials Kobe Tools Corporation, Akashi (JP); Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 10/493,052

(22) PCT Filed: Oct. 28, 2002

(86) PCT No.: PCT/JP02/11153

§ 371 (c)(1),
(2), (4) Date: Apr. 28, 2004

(87) PCT Pub. No.: WO03/037554

PCT Pub. Date: May 8, 2003

(65) Prior Publication Data

US 2005/0019612 A1    Jan. 27, 2005

(30) Foreign Application Priority Data

Oct. 30, 2001 (JP) ............................. 2001-332806
Nov. 15, 2001 (JP) ............................. 2001-349878

(51) Int. Cl.
*B23B 27/14* (2006.01)
(52) U.S. Cl. .................. 428/698; 51/307; 51/309; 428/216; 428/336; 428/697; 428/699; 407/119
(58) Field of Classification Search .............. 51/295, 51/307, 309; 407/119; 428/216, 336, 697, 428/698, 699
See application file for complete search history.

(56) References Cited

U.S. PATENT DOCUMENTS 5,580,653 A * 12/1996 Tanaka et al. ............... 407/119
6,071,560 A *  6/2000 Braendle et al. ......... 204/192.38
6,274,249 B1 *  8/2001 Braendle et al. ............. 428/699
6,395,379 B1 *  5/2002 Braendle ..................... 51/307

FOREIGN PATENT DOCUMENTS

| JP | 63-89202 | 4/1988 |
|----|----------|--------|
| JP | 6-116731 | 4/1994 |
| JP | 7-310174 | 11/1995 |
| JP | 8-209336 | 8/1996 |
| JP | 9-170068 | 6/1997 |
| JP | 10-317123 | 12/1998 |
| JP | 10-330914 | 12/1998 |
| JP | 11-131216 | 5/1999 |
| JP | 11-310867 | * 11/1999 |
| JP | 2001-234328 | 8/2001 |

* cited by examiner

*Primary Examiner*—Archene Turner
(74) *Attorney, Agent, or Firm*—Oblon, Spivak, McClelland, Maier & Neustadt, P.C.

(57) ABSTRACT

The invention provides a coated cutting tool made of cemented carbide in which a hard coating layer has excellent wear resistance in high-speed cutting operation, wherein (a) a crystal orientation hysteresis layer which consists of a carbonitride compound layer and (b) a hard coating layer which consists of a layer of nitride compound and has a well defined crystal orientation and/or degree of crystallinity are formed on the surface of a cemented carbide substrate, preferably on the surface of a tungsten carbide based cemented carbide or titanium carbonitride based cermet by physical vapor deposition, wherein the crystal orientation hysteresis layer is deposited between the surface of a cemented carbide substrate and the hard coating layer. In one specific example, (a1) the carbonitride compound layer has an average thickness of 0.05 to 0.5 μm and is preferably a Ti—Al carbonitride compound layer expressed by the composition formula as $(Ti_{1-X}Al_X)(N_{1-Y}C_Y)$, wherein X ranges from 0.05 to 0.20 and Y ranges from 0.01 to 0.15 by atomic ratio and (b1) the nitride compound layer has an average thickness of 2 to 15 μm and is preferably a Ti—Al nitride compound layer expressed by the composition formula as $(Ti_{1-Z}Al_Z)N$, wherein Z ranges from 0.45 to 0.65 by atomic ratio. In another specific example, (a2) the carbonitride compound layer has an average thickness of 0.05 to 0.5 μm and is preferably a Ti—Al carbonitride compound layer expressed by the composition formula as $(Ti_{1-X}Al_X)(N_{1-Y}C_Y)$, wherein X ranges from 0.01 to 0.15 and Y ranges from 0.01 to 0.15 by atomic ratio and (b2) the nitride compound layer has an average thickness of 2 to 10 μm and is preferably a Al—Ti—Si nitride compound layer expressed by the composition formula as $(Al_{1-(A+B)}Ti_A Si_B)N$, wherein A ranges from 0.35 to 0.55 and B ranges from 0.05 to 0.20 by atomic ratio.

6 Claims, 8 Drawing Sheets

CUTTING EDGE

FLUTE

SHANK

SURFACE COATED CEMENTED CARBIDE CUTTING TOOL HAVING HARD COATING LAYER EXHIBITING EXCELLENT WEAR RESISTANCE IN HIGH SPEED MACHINING

FIELD OF THE INVENTION

The present invention relates to a cemented carbide cutting tool with a surface layer (hereinafter referred to as coated cemented carbide tool) in which a hard coating layer has excellent heat resistance so as to show high wear resistance even when it is applied to a high-speed cutting operation on various steels and cast irons accompanied by high heat generation.

In general, many kinds of cutting tools are known. Indexable type cutting inserts are used in various cutting operations such as turning or planing of a workpiece made of various steels or cast irons while being exchangably attached on a tip of a cutting tool. Twist drills and micro drills that are used for drilling of the above-mentioned workpiece are also well known. Furthermore, solid type end-milling cutters, used in various operations such as face milling, slotting and shoulder milling of the workpiece are widely used. In an analogous fashion to the solid type end-milling cutters, indexable type end-milling cutters for cutting operation are also known as cutting tools to which the indexable cutting inserts are exchangably attached.

As such a cutting tool, a coated cemented carbide tool is well known in which a hard coating layer with an average thickness of 2 to 15 μm consisting of a layer of Ti—Al nitride compound (hereinafter referred to as (Ti, Al)N) is deposited on a substrate made of tungsten carbide (hereinafter referred to as WC) based cemented carbide or titanium carbonitride (hereinafter referred to as TiCN) based cermet (hereinafter the substrate is generically referred to as cemented carbide substrate) by using physical vapor deposition. Here, the composition formula of the Ti—Al nitride compound layer is expressed by $(Ti_{1-Z}Al_Z)N$, wherein Z ranges from 0.45 to 0.65 by atomic ratio. It is also well known that such coated cemented carbide tool is preferably used for continuous cutting operation as well as interrupted cutting operation on various steels or cast irons.

It is known that the above-mentioned coated cemented carbide tool is made by vapor deposition of the hard coating layer consisting of the (Ti, Al)N layer on the surface of the cemented carbide substrate as follows: First, the cemented carbide substrate is set into a chamber of an arc ion plating system, which is one of the physical vapor deposition processes, having an arrangement as shown in FIG. 5; the (Ti, Al)N layer is then coated under the following conditions, that is, for example, at first, in a condition of about 0.5 Pa and 500° C. achieved by a heater inside the chamber, an arc discharge is generated between an anode and a cathode (an evaporation source) in which an Ti—Al alloy having predetermined composition is set, by loading electrical potential of 35V and electrical current of 90A, while nitrogen gas is introduced as a reaction gas into the chamber, and the bias DC voltage of, for example –200V, is applied to the substrate.

Another coated cemented carbide tool is also well known as a cutting tool in a similar fashion to the above described tool, wherein a hard coating layer with an average thickness of 2 to 10 μm consisting of a layer of A—Ti—Si nitride compound (hereinafter referred to as (Al, Ti, Si)N) is deposited on a substrate made of WC based cemented carbide or TiCN based cermet by using physical vapor deposition. Here, the composition formula of the A—Ti—Si nitride compound layer is expressed by $(Al_{1-(A+B)}Ti_ASi_B)N$, wherein A ranges from 0.35 to 0.55 and B ranges from 0.05 to 0.20 by atomic ratio. It is also well known that such coated cemented carbide tool is preferably used for continuous cutting operation as well as interrupted cutting operation on various steels or cast irons.

It is known that the above-mentioned coated cemented carbide tool is made by vapor deposition of the hard coating layer consisting of the (Al, Ti, Si)N layer on the surface of the cemented carbide substrate as follows: First, the cemented carbide substrate is set into a chamber of an arc ion plating system, which is one of the physical vapor deposition processes, having an arrangement as shown in FIG. 5; the (Al, Ti, Si)N layer is then coated under the following conditions, that is, for example, at first, in a condition of about 450° C. achieved by a heater inside the chamber, an arc discharge is generated between an anode and a cathode (an evaporation source) in which an Al—Ti—Si alloy having predetermined composition is set, by loading electrical potential of 40V and electrical current of 130A, while nitrogen gas is introduced as a reaction gas into the chamber up to 2 Pa, and the bias DC voltage of, for example, –50V, is applied to the substrate.

In recent years, cutting operation apparatuses tend to have significantly high performance on one hand, and it is strongly demanded that cutting operations be performed with less power and less energy as well as low cost on the other hand. Therefore, cutting operations tend to be performed at high speed. With regard to various kinds of coated cutting tools conventionally proposed, as long as they are used in cutting operations under the usual cutting conditions, they have almost no problem. However, once they are used in high speed cutting operations accompanied by high heat generation, their operation lifetime becomes shorter due to accelerated abrasion of the hard coating layer.

In view of the above circumstances, the inventors have conducted research to develop coated cemented carbide tools having excellent wear resistance in high-speed cutting operations while focusing attention on the hard coating layer formed on the conventional coated cemented carbide tool, and found the following results (a1) and (b1):

(a1) Measurements by Cu K α radiation using an X-ray diffractometer show that the hard coating layer consisting of the (Ti, Al)N layer formed on the coated cemented carbide tool exhibits an X-ray diffraction pattern in which a peak of not less than 0.9 degrees FWHM (full width at half maximum) in 2θ (abscissa) is found at a (200) plane as shown in FIG. 2. Forming a layer of carbonitride compound containing Ti and Al (hereinafter referred to as (Ti, Al)NC) expressed by the composition formula as $(Ti_{1-X}Al_X)(N_{1-Y}C_Y)$ (wherein X: 0.05 to 0.20, and Y: 0.01 to 0.15 by atomic ratio) with an extremely thin average thickness of 0.05 to 0.5 μm on the surface of the cemented carbide substrate by vapor deposition before the hard coating layer is formed on the substrate by physical vapor deposition, the (Ti, Al)NC layer is well oriented in a (200) plane so that it exhibits an X-ray diffraction pattern in which a peak of not more than 0.6 degrees FWHM in 2θ is found at the (200) plane. Due to the crystal orientation of the (Ti, Al)NC layer with a hysteresis effect, as the (Ti, Al)N layer (or the hard coating layer) is formed on the (Ti, Al)NC layer by physical vapor deposition, it will also exhibit an X-ray diffraction pattern in which a peak of not more than 0.6 degrees FWHM in 2θ is found at a (200) plane, indicating a high degree of crystallinity as shown in FIG. 1, although the (Ti, Al)N layer would inherently exhibit an X-ray diffraction pattern, in which a peak of not less than 0.9 degrees FWHM in 2θ be found at the (200) plane, without the (Ti, Al)NC layer.

(b1) The (Ti, Al)N layer with a well oriented crystal structure having a peak of not more than 0.6 degrees FWHM in 2θ at a (200) plane in the X ray diffraction pattern exhibits excellent heat resistance (i.e., resistance to oxidation and hardness at high temperature) in comparison with a (Ti, Al)N layer having a peak of not less than 0.9 degrees FWHM. That leads to the result that the coated cemented carbide tool performs high-speed cutting operations on steels and mild steels at high temperature and has excellent wear resistance, in which the hard coating layer consisting of the (Ti, Al)N layer with a well oriented crystal structure (or having a narrow FWHM) is formed on the surface of the cemented carbide substrate by physical vapor deposition.

Moreover, from another viewpoint, the inventors have conducted research to develop coated cemented carbide tools having excellent wear resistance in high-speed cutting operations while focusing attention on the hard coating layer formed on the conventional coated cemented carbide tool, and found the following results (a2) and (b2):

(a2) Measurements by Cu K a radiation using an X-ray diffractometer show that the hard coating layer consisting of the (Al, Ti, Si)N layer formed on the coated cemented carbide tool exhibits an X-ray diffraction pattern in which a peak of not less than 0.9 degrees FWHM (full width at half maximum) in 2θ (abscissa) is found at a (200) plane as shown in FIG. 4. Forming a layer of Ti based carbonitride compound (hereinafter referred to as (Ti, Al)NC) expressed by the composition formula as $(Ti_{1-X}Al_X)(N_{1-Y}C_Y)$ (wherein X: 0.01 to 0.15, and Y: 0.01 to 0.15 by atomic ratio) with an extremely thin average thickness of 0.05 to 0.5 μm on the surface of the cemented carbide substrate by vapor deposition before the hard coating layer is formed on the substrate by physical vapor deposition, the (Ti, Al)NC layer is well oriented in a (200) plane so that it has a peak of not more than 0.6 degrees FWHM in 2θ at the (200) plane. Due to the crystal orientation of the (Ti, Al)NC layer with a hysteresis effect, as the (Al, Ti, Si)N layer is formed on the (Ti, Al)NC layer by physical vapor deposition, it will exhibit an X-ray diffraction pattern in which a peak of not more than 0.6 degrees FWHM in 2θ is found at the (200) plane, indicating a high degree of crystallinity as shown in FIG. 3, although the (Al, Ti, Si)N layer would inherently exhibit an X-ray diffraction pattern, in which a peak of not less than 0.9 degrees FWHM in 2θ be found at the (200) plane, without the (Ti, Al)NC layer.

(b2) The (Al, Ti, Si)N layer with a well oriented crystal structure having a peak of not more than 0.6 degrees FWHM in 2θ at a (200) plane in the X ray diffraction pattern exhibits excellent heat resistance (i.e., resistance to oxidation and hardness at high temperature) in comparison with a (Al, Ti, Si)N layer having a peak of not less than 0.9 degrees FWHM. That leads to the result that the coated cemented carbide tool performs high-speed cutting operations on steels and mild steels at high temperature and has excellent wear resistance, in which the hard coating layer consisting of the (Al, Ti, Si)N layer with a well oriented crystal structure (or with a narrow FWHM) is formed on the surface of the cemented carbide substrate by physical vapor deposition.

DISCLOSURE OF THE INVENTION

The present invention was conceived based on the above research results, and the present invention provides a coated cutting tool made of cemented carbide in which a hard coating layer has excellent wear resistance in high-speed cutting operations, wherein:

(a) a layer affecting the crystal orientation by a hysteresis effect (hereinafter referred as a crystal orientation hysteresis layer) which consists of a layer of carbonitride compound is formed on the surface of a cemented carbide substrate, preferably on the surface of a tungsten carbide based cemented carbide or titanium carbonitride based cermet; and (b) a hard coating layer that consists of a layer of nitride compound and has a well defined crystal orientation and/or degree of crystallinity is formed on the crystal orientation hysteresis layer by physical vapor deposition.

According to the first embodiment of the present invention, (a1) the carbonitride compound layer has an average thickness of 0.05 to 0.5 μm and is a Ti—Al carbonitride compound layer expressed by the composition formula as $(Ti_{1-X}Al_X)(N_{1-Y}C_Y)$ (wherein X: 0.05 to 0.20, Y: 0.01 to 0.15 by atomic ratio); and (b1) the nitride compound layer has an average thickness of 2 to 15 μm and is a layer of Ti—Al nitride compound expressed by the composition formula as $(Ti_{1-Z}Al_Z)N$ (wherein Z: 0.45 to 0.65 by atomic ratio).

Here, the Ti—Al carbonitride compound layer is preferably a layer which exhibits an X-ray diffraction pattern having a peak found at a (200) plane with FWHM of not more than 0.6 degrees in 2θ measured by Cu K a radiation using an X-ray diffractometer, and the layer of Ti—Al nitride compound is also preferably a layer which exhibits an X-ray diffraction pattern having a peak found at a (200) plane with FWHM of not more than 0.6 degrees in 2θ measured by Cu K a radiation using an X-ray diffractometer.

In the following, regarding the coated cemented carbide tool according to the first embodiment of the present invention, the reason that the average thickness and the composition of the crystal orientation hysteresis layer and the hard coating layer formed on the coated cemented carbide tool were limited as described above will be explained.

(a1) Crystal Orientation Hysteresis Layer ((Ti, Al)NC Layer)

The aluminum (Al) component in the (Ti, Al)NC layer plays an important role in defining a (200) plane of this layer to be aligned parallel to the face and the flank of the cutting edge; if the Al ratio is less than 0.05 by atomic ratio, the degree of the alignment of the crystal in the (200) plane is not sufficiently high, and on the other hand, if the Al ratio is more than 0.20, the degree of crystallinity is decreased so that it becomes difficult to adjust FWHM of the peak at the (200) plane to a width of not more than 0.6 degrees in 2θ; therefore, the ratio (X-value) was set from 0.05 to 0.20.

Also, the carbon (C) component in the (Ti, Al)NC layer improves adhesion for both the cemented carbide substrate surface and the hard coating layer; if the C ratio is less than 0.01 by atomic ratio, the desired effect to improve the adhesion cannot be obtained anymore; and on the other hand, if the C ratio is greater than 0.15, the crystal orientation is so disordered that it becomes difficult to align the crystal orientation in the (200) plane in a high degree; therefore, the ratio (Y-value) was set from 0.01 to 0.15.

Further, if the average thickness of the crystal orientation hysteresis layer is less than 0.05 μm, the hysteresis effect to align the crystal orientation, in which the texture or alignment of the (Ti, Al)NC layer to the (200) plane in a high degree is transferred to the hard coating layer, is not fully used; and the cemented carbide substrate surface and the hard coating layer are not sufficiently adhered; and on the other hand, in the case in which the average thickness of the crystal orientation hysteresis layer is up to 0.5 µm, the hysteresis effect to align the crystal orientation and the effect to improve the adhesion are fully achieved; therefore the average thickness of the layer was set to from 0.05 to 0.5 µm.

(b1) hard coating layer ((Ti, Al)N layer)

The Al component is contained in the (Ti, Al)N layer in order to increase thermal resistance and hardness of the TiN layer having high tenacity and so improve wear resistance thereof; if the ratio of Al to the sum of Al and Ti (i.e., atomic ratio of Al) is less than 0.45, the desired effect to improve the wear resistance cannot be obtained anymore; and on the other hand, if the ratio of Al is more than 0.65, the cutting edge tends to easily chip (small chipping); therefore, the ratio was set from 0.45 to 0.65.

Also, if the average thickness of the hard coating layer is less than 2 µm, desired wear resistance cannot be obtained; and the other hand, if the average thickness is more than 15 µm, the cutting edge tends to easily chip; therefore, the average thickness was set to from 2 to 15 µm.

Further, a value of not more than 0.6 degrees (2θ) for FWHM of the peak at the (200) plane in the X-ray diffraction pattern was chosen on the basis of the experimental result: This is because, in the case of FWHM of not more than 0.6 degrees, the hard coating layer has excellent wear resistance especially in high-speed cutting operation; and on the other hand, in the case of FWHM of more than 0.6 degrees or the lowered degree of the crystallinity in the (200) plane, desired wear resistance cannot be achieved anymore.

Next, according to the second embodiment of the present invention, (a2) the carbonitride compound layer has an average thickness of 0.05 to 0.5 µm and is a Ti—Al carbonitride compound layer expressed by the composition formula as $(Ti_{1-X}Al_X)(N_{1-Y}C_Y)$ (wherein X: 0.01 to 0.15, Y: 0.01 to 0.15 by atomic ratio).

(b2) the nitride compound layer has an average thickness of 2 to 10 µm and is a A—Ti—Si nitride compound layer expressed by the composition formula as $(Al_{1-(A+B)}Ti_A Si_B)N$ (wherein A: 0.35 to 0.55, B: 0.05 to 0.20 by atomic ratio).

Here, the Ti—Al carbonitride compound layer is preferably a layer which exhibits an X-ray diffraction pattern having a peak found at a (200) plane with FWHM of not more than 0.6 degrees in 2θ measured by Cu K a radiation using an X-ray diffractometer, and the A—Ti—Si nitride compound layer is also preferably a layer which exhibits an X-ray diffraction pattern having a peak found at a (200) plane with FWHM of not more than 0.6 degrees in 2θ measured by Cu K a radiation using an X-ray diffractometer.

In the following, regarding the coated cemented carbide tool according to the second embodiment of the present invention, the reason that the average thickness and the composition of the crystal orientation hysteresis layer and the hard coating layer formed on the coated cemented carbide tool were limited as described above will be explained.

(a2) Crystal Orientation Hysteresis Layer ((Ti, Al)NC Layer)

The aluminum (Al) component in the (Ti, Al)NC layer plays an important role in defining the (200) plane of the layer to be aligned parallel to the face and the flank of the cutting edge; if the ratio of Al to the sum of Al and Ti (i.e., atomic ratio of Al) is less than 0.01, the degree of the alignment of the crystal in the (200) plane is not sufficiently high, and on the other hand, if the Al ratio is more than 0.15, the degree of crystallinity is decreased so that it becomes difficult to adjust FWHM of the peak at the (200) plane to a width of not more than 0.6 degrees in 2θ; therefore, the ratio (X-value) was set from 0.01 to 0.15.

Also, the C component in the (Ti, Al)NC layer improves adhesion for both the cemented carbide substrate surface and the hard coating layer; if the C ratio is less than 0.01 by atomic ratio, a desired effect to improve the adhesion cannot be obtained anymore; and on the other hand, if the C ratio is greater than 0.15, the crystal orientation is so disordered that it becomes difficult to align crystal orientation in the (200) plane in a high degree; therefore, the ratio (Y-value) was set from 0.01 to 0.15.

Further, if the average thickness of the crystal orientation hysteresis layer is less than 0.05 µm, the hysteresis effect to align the crystal orientation, in which the texture or alignment of the (Ti, Al)NC layer to the (200) plane in a high degree is transferred to the hard coating layer, is not fully used; and on the other hand, in the case in which the average thickness of the crystal orientation hysteresis layer is up to 0.5 µm, the hysteresis effect to align the crystal orientation is fully achieved; therefore the average thickness of the layer was set to from 0.05 to 0.5 µm.

(b2) Hard Coating Layer ((Al, Ti, Si)N Layer)

The Ti component in the (Al, Ti, Si)N layer increases strength and toughness of the layer itself; if the ratio of Ti to the sum of Ti, Al and Si (i.e., atomic ratio of Ti) is less than 0.35, the effect increasing strength and toughness is not obtained as one desires; and the other hand, if the ratio is more than 0.55, wear resistance of the layer is decreased; therefore, the ratio was set to from 0.35 to 0.55.

Also, the Si component in the (Al, Ti, Si)N layer improves heat resistance and hardness at high temperature of the layer so that wear resistance of the layer is affected to be improved; if the ratio of Si to the sum of Si, Al and Ti (i.e., atomic ratio of Si) is less than 0.05, the effect improving wear resistance is not obtained as one desires; and the other hand, if the ratio is more than 0.20, strength and toughness are decreased and the cutting edge tends to easily chip; therefore, the ratio was set from 0.05 to 0.20.

Also, if the average thickness of the hard coating layer is less than 2 µm, desired wear resistance cannot be achieved; and the other hand, if the average thickness is more than 10 µm, the cutting edge tends to easily chip; therefore, the average thickness was set to from 2 to 10 µm.

Further, a value of not more than 0.6 degrees (2θ) for FWHM of the peak at the (200) plane in the X-ray diffraction pattern was chosen on the basis of the experimental result: This is because, in the case of FWHM of not more than 0.6 degrees, the hard coating layer has excellent wear resistance especially in high-speed cutting operation; and on the other hand, in the case of FWHM of more than 0.6 degrees or the lowered degree of the crystallinity in the (200) plane, desired wear resistance cannot be achieved anymore.

DESCRIPTION OF THE PREFERRED EMBODIMENTS

In the following, a coated cemented carbide tool according to the first embodiment of the present invention will be explained based on examples.

EXAMPLE 1

Ingredient powders, i.e., WC powder, TiC powder, ZrC powder, VC powder, TaC powder, NbC powder, $Cr_3C_2$ powder, TiN powder, TaN powder, and Co powder, all of which have an average grain size in a range from 1 to 3 μm, were prepared and mixed in accordance with compounding ratios as presented in TABLE 1. The ingredient powders were mixed under wet conditions using a ball mill for 72 hours, were dried, and were compacted under pressure of 100 MPa so as to form a green compact. The green compact was held in a vacuum (pressure of 6 Pa) at a predetermined temperature of 1400° C. for 1 hour so as to be sintered. After sintering, the honing of R: 0.05 is given to the part of the cutting edge so that cemented carbide substrates made from the WC base cemented carbide A1–A10 meeting ISO CNMG120408 geometrical configuration of insert were made, respectively.

Also, ingredient powders, i.e., TiCN (wherein TiC/TiN=50/50 by mass ratio) powder, $Mo_2C$ powder, ZrC powder, NbC powder, TaC powder, WC powder, Co powder, and Ni powder, all of which have an average grain size in a range from 0.5 to 2 μm, were prepared and mixed in accordance with compounding ratios as shown in TABLE 2. The ingredient powders were mixed under wet conditions using a ball mill for 24 hours, were dried, and were compacted under pressure of 100 MPa so as to form a green compact. The green compact was held in a nitrogen atmosphere (pressure of 2 kPa) at a predetermined temperature of 1500° C. for 1 hour so as to be sintered. After sintering, the honing of R: 0.03 is given to the part of the cutting edge so that cemented carbide substrates made from the TiCN based cermet B1–B6 meeting ISO CNMG120408 geometrical configuration of insert were made, respectively.

Figure 1:
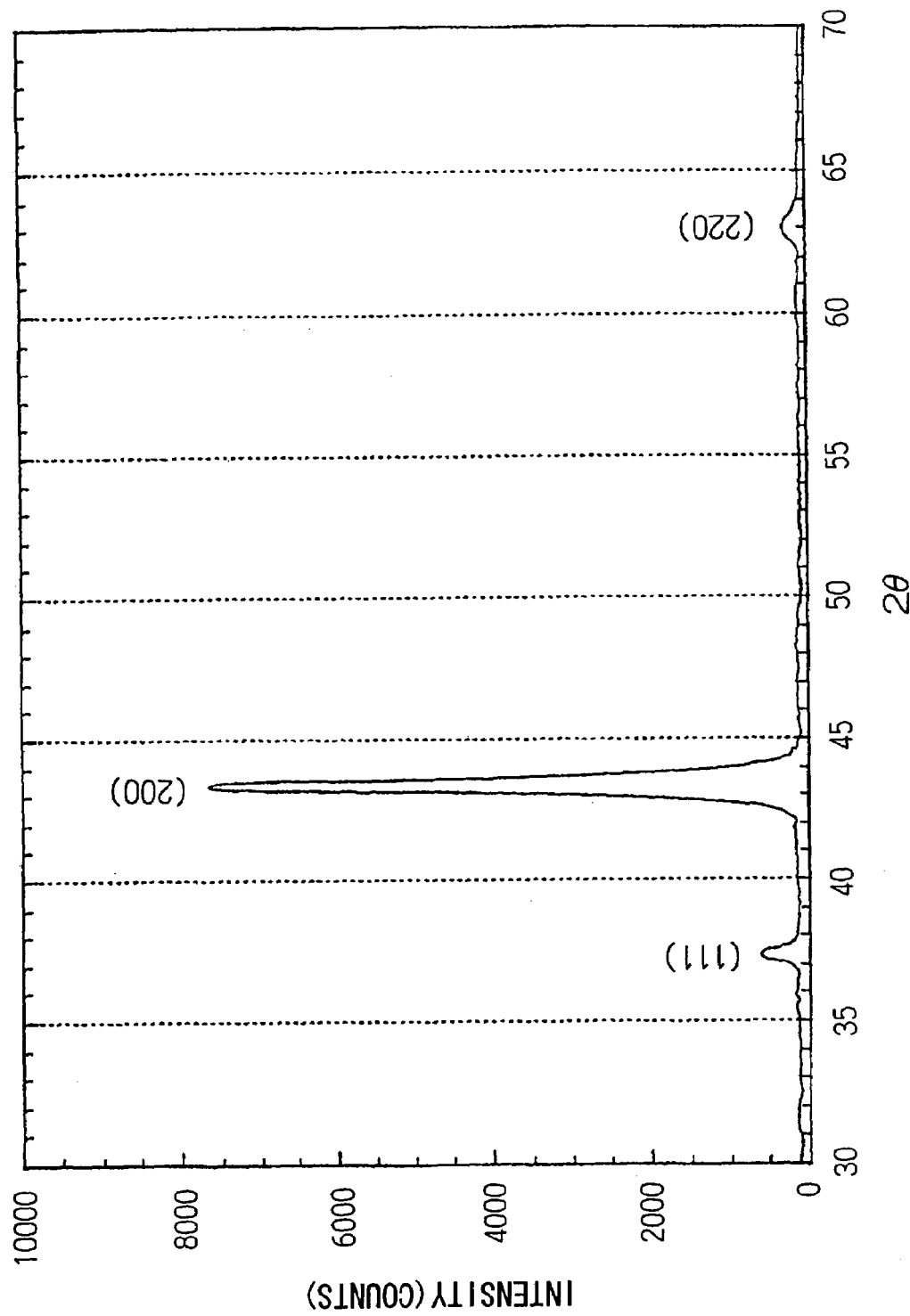
FIG. 1 shows an X-ray diffraction pattern of a hard coating layer of a coated cemented carbide insert according to the first embodiment of the present invention.
Figure 2:
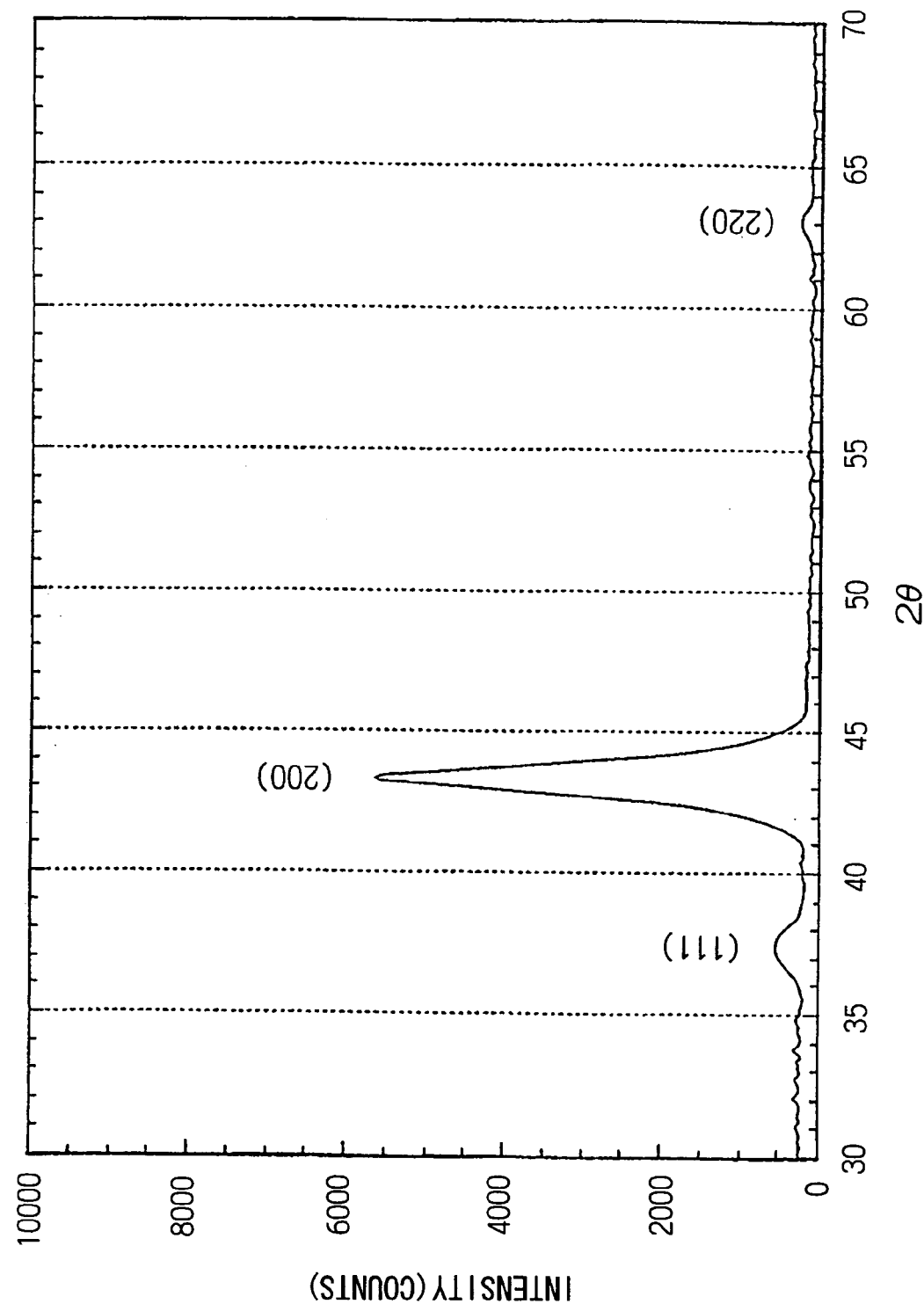
FIG. 2 shows an X-ray diffraction pattern of a hard coating layer of a conventional coated cemented carbide insert.
Figure 3:
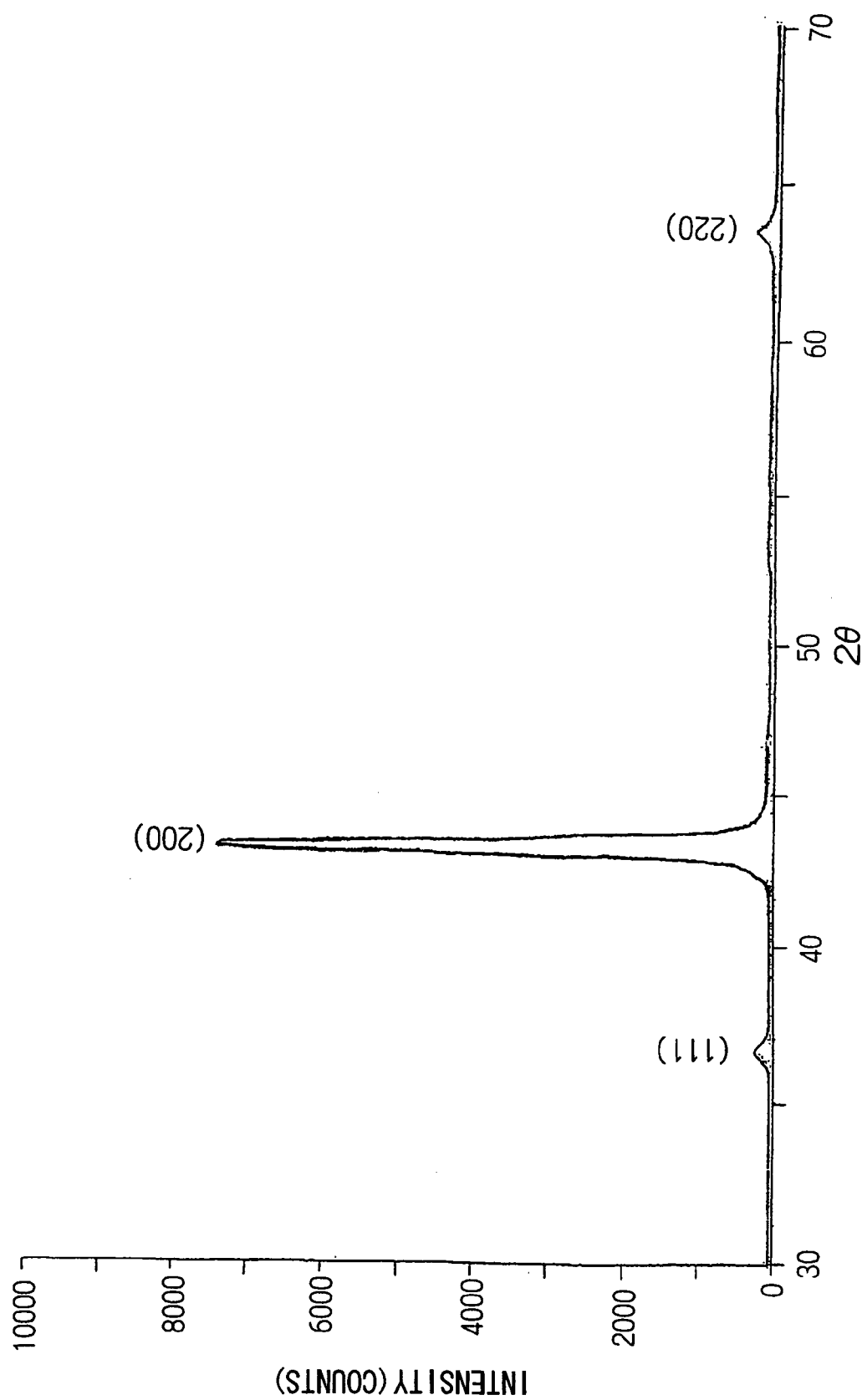
FIG. 3 shows an X-ray diffraction pattern of a hard coating layer of a coated cemented carbide insert according to the second embodiment of the present invention.
Figure 4:
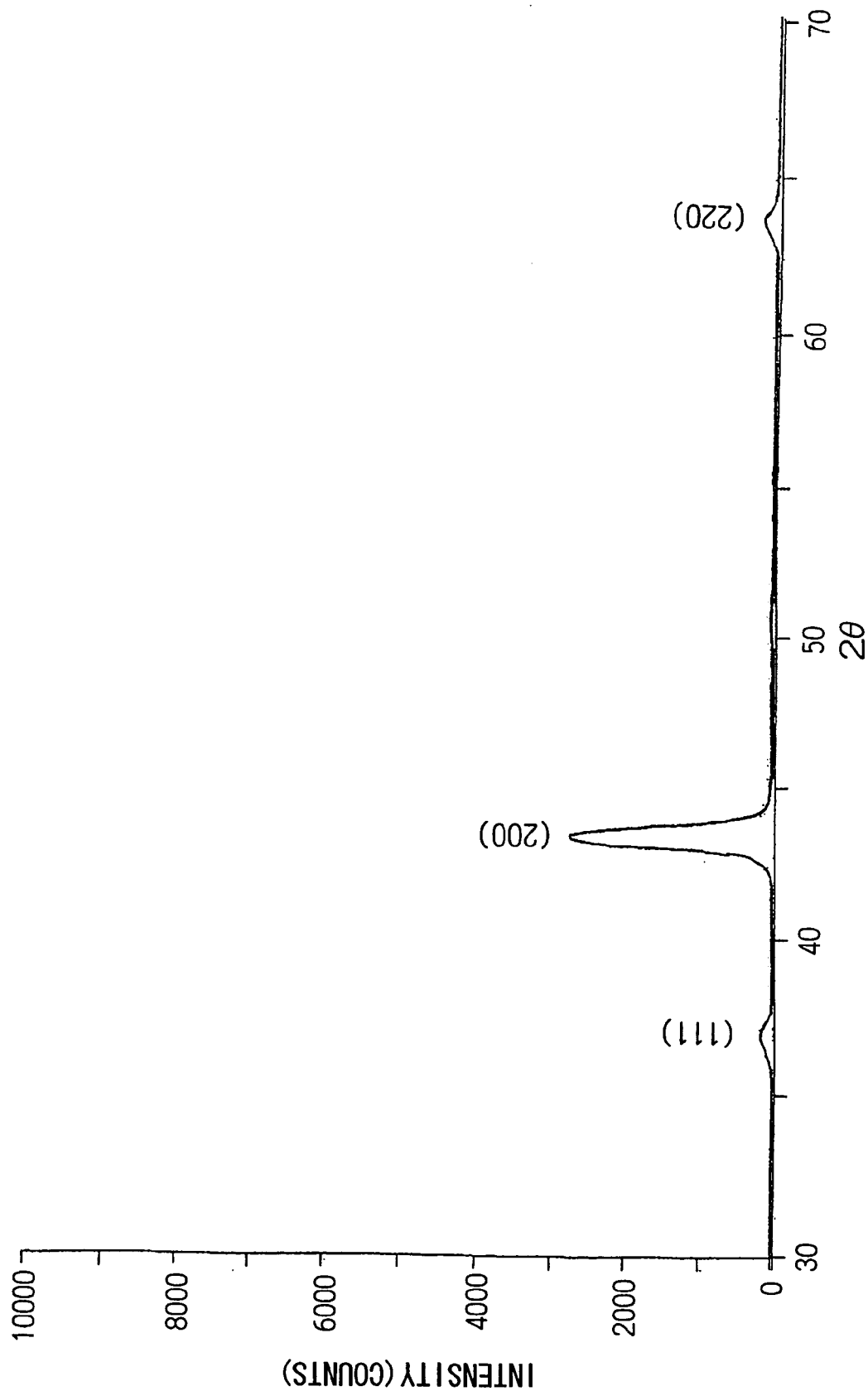
FIG. 4 shows an X-ray diffraction pattern of a hard coating layer of another conventional coated cemented carbide insert.
Figure 5:
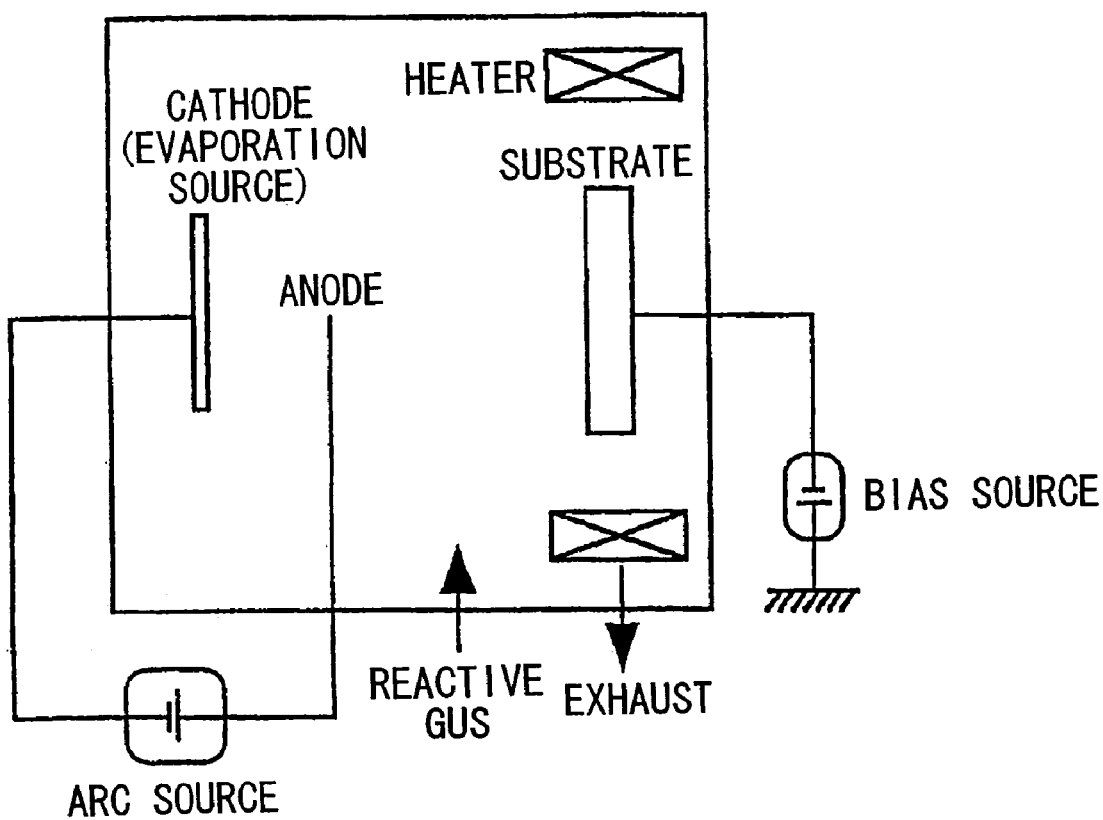
FIG. 5 shows an explanatory drawing of the arc ion plating equipment.
Figure 6A:
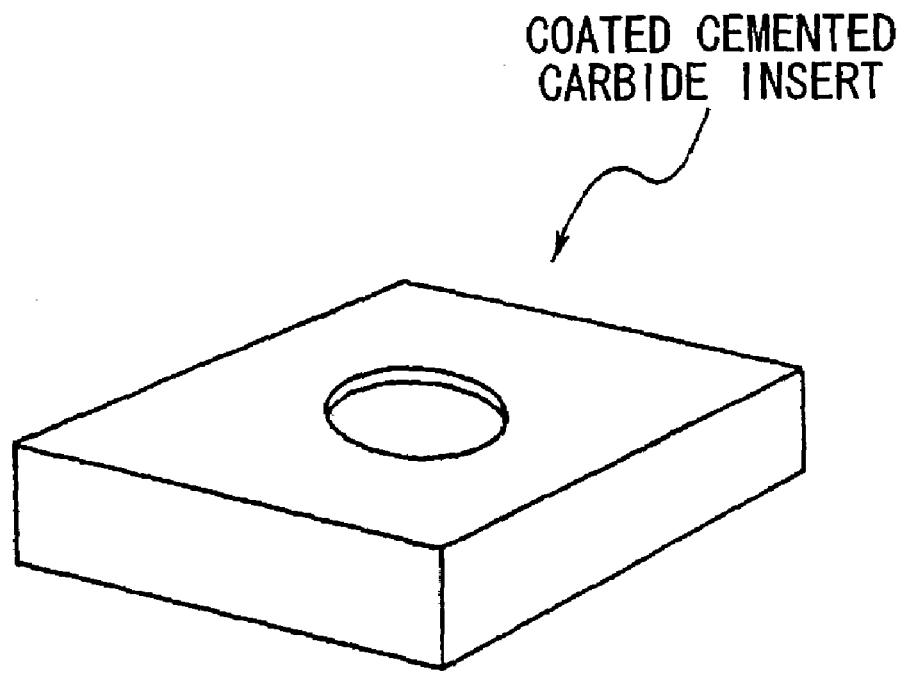
FIG. 6A shows a perspective diagram of a coated cemented carbide insert, and FIG. 6B a cross-sectional view of the coated cemented carbide insert.
Figure 6B:
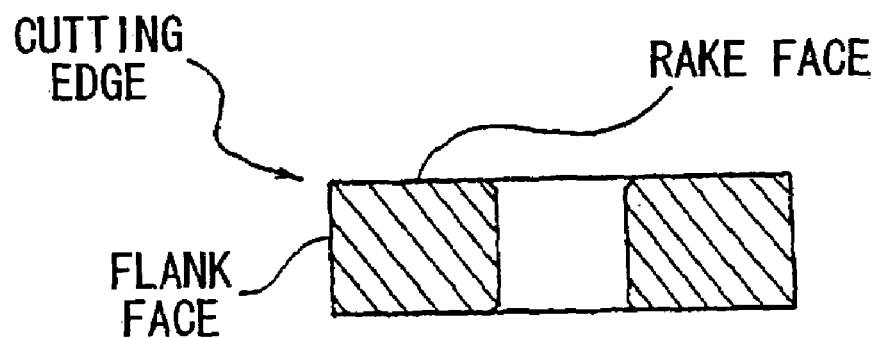

Next, these cemented carbide substrates A1–A10 and B1–B6 were subjected to ultrasonic cleaning in an acetone solvent, were dried, and set in an ordinary arc ion plating apparatus as shown in FIG. 5, respectively. Meanwhile, the Ti—Al alloys for the hard coating layer and the Ti—Al alloys for the crystal orientation hysteresis layer having various compositions were set to form the cathode (evaporation source), and the inside of the apparatus is evacuated to keep 0.5 Pa and heated to 500° C. by the heater. Then, Ar was introduced in the apparatus to make the Ar atmosphere of 10 Pa. Under this condition, the DC bias voltage of −800V was applied to the cemented carbide substrate, and the surface of the substrate was cleaned by Ar bombardment. Next, while introducing mixed gas of nitrogen gas and methane gas at a predetermined mixture ratio as reaction gas in the apparatus and setting to a reaction pressure of 3.5 Pa, the bias voltage applied to the above-mentioned substrate was lowered to −70 V, and the arc discharge was generated between the above-mentioned cathode (Ti—Al alloy for the crystal orientation hysteresis layer) and the anode. Then, the crystal orientation hysteresis layer (the (Ti, Al)NC layer) having the designated composition and thickness, which is shown in TABLES 3 and 4, was formed on the surface of the cemented carbide substrates A1–A10 and B1–B6, respectively. For the next step, while introducing nitrogen gas as reaction gas in the apparatus and setting to a reaction pressure of 4 Pa, the bias voltage applied to the above-mentioned substrate was lowered to −20 V, and the arc discharge was generated between the above-mentioned cathode (Ti—Al alloy for the hard coating layer) and the anode so that the hard coating layer ((Ti, Al)N layer) having the designated composition and thickness, which is shown in TABLES 3 and 4, was formed by vapor deposition. In this way, indexable type cutting inserts made of cemented carbide with surface coating of the present invention 1–20 (hereinafter referred to as a coated cemented carbide inserts of the present invention) having a geometrical configuration as shown in FIG. 6A as a perspective view and in FIG. 6B as a cross-sectional view were manufactured as coated cemented carbide tools of the present invention.

Moreover, conventional indexable type cutting inserts made of cemented carbide with surface coating 1–20 (hereinafter referred to as a conventional coated cemented carbide insert) as conventional coated cemented carbide tools were made as control samples as presented in TABLES 5 and 6, which are configured as with the inserts of the present invention excepting that the crystal orientation hysteresis layer ((Ti, Al)NC layer) is not formed.

Next, the coated cemented carbide inserts of the present invention 1–20 and the conventional coated cemented carbide inserts 1–20 were subjected to a high-speed, dry, turning operation test, by screw setting these inserts at the top of the cutting tool made of a tool steel. The detailed test conditions were set as follows:

for a test of high-speed, dry, continuous turning of alloyed steel;

workpiece: JIS (Japanese Industrial Standard) SCM440 round bar;

cutting speed: 250 m/min.;

depth of cutting: 1.5 mm;

feed: 0.2 mm/rev.; and time: 10 min.;

for a test of high-speed, dry, interrupted turning of carbon steel;

workpiece: JIS S45C round bar with four flutes evenly spaced in the direction of the length;

cutting speed: 280 m/min.;

depth of cutting: 2.0 mm;

feed: 0.3 mm/rev.; and time: 5 min.;

for a test of high-speed, dry, interrupted turning of cast iron;

workpiece: JIS FC300 round bar with four flutes evenly spaced in the direction of the length;

cutting speed: 180 m/min.;

depth of cutting: 1.5 mm;

feed: 0.3 mm/rev.; and time: 5 min.;

The flank wear of the cutting edge was measured in each test. These results of the measurements are shown in TABLES 7 and 8, respectively.

TABLE 1

| TYPE | | Co | TiC | ZrC | VC | TaC | NbC | Cr$_3$C$_2$ | TiN | TaN | WC |
|---|---|---|---|---|---|---|---|---|---|---|---|
| CEMENTED CARBIDE SUBSTRATE | A-1 | 10.5 | 8 | — | — | 8 | 1.5 | — | — | — | balance |
| | A-2 | 7 | — | — | — | — | — | — | — | — | balance |
| | A-3 | 5.7 | — | — | — | 1.5 | 0.5 | — | — | — | balance |
| | A-4 | 5.7 | — | — | — | — | — | 1 | — | — | balance |
| | A-5 | 8.5 | — | 0.5 | — | — | — | 0.5 | — | — | balance |
| | A-6 | 9 | — | — | — | 2.5 | 1 | — | — | — | balance |
| | A-7 | 9 | 8.5 | — | — | 8 | 3 | — | — | — | balance |
| | A-8 | 11 | 8 | — | — | 4.5 | — | — | 1.5 | — | balance |
| | A-9 | 12.5 | 2 | — | — | — | — | — | 1 | 2 | balance |
| | A-10 | 14 | — | — | 0.2 | — | — | 0.8 | — | — | balance |

TABLE 2

| TYPE | | Co | Ni | ZrC | TaC | NbC | MO$_2$C | WC | TiCN |
|---|---|---|---|---|---|---|---|---|---|
| CEMENTED CARBIDE SUBSTRATE | B-1 | 13 | 5 | — | 10 | — | 10 | 16 | balance |
| | B-2 | 8 | 7 | — | 5 | — | 7.5 | — | balance |
| | B-3 | 5 | — | — | — | — | 6 | 10 | balance |
| | B-4 | 10 | 5 | — | 11 | 2 | — | — | balance |
| | B-5 | 9 | 4 | 1 | 8 | — | 10 | 10 | balance |
| | B-6 | 12 | 5.5 | — | 10 | — | 9.5 | 14.5 | balance |

TABLE 3

| | | Cemented Carbide Substrate No. | Crystal Orientation Hysteresis Layer ((Ti, Al)NC layer) | | | | | Hard Coating Layer ((Ti, Al)N layer) | | | | |
|---|---|---|---|---|---|---|---|---|---|---|---|---|
| | | | Designated Composition (atomic ratio) | | | | Designated Thickness (μm) | FWHM at (200) plane (degree) | Designated Composition (atomic ratio) | | | Designated Thickness (μm) | FWHM at (200) plane (degree) |
| TYPE | | | Ti | Al | N | C | | | Ti | Al | N | | |
| CUTTING INSERT OF THE PRESENT INVENTION | 1 | A-1 | 0.95 | 0.05 | 0.97 | 0.03 | 0.05 | 0.28 | 0.45 | 0.55 | 1.00 | 3 | 0.52 |
| | 2 | A-2 | 0.93 | 0.07 | 0.89 | 0.11 | 0.5 | 0.42 | 0.50 | 0.50 | 1.00 | 6.5 | 0.50 |
| | 3 | A-3 | 0.91 | 0.09 | 0.90 | 0.10 | 0.1 | 0.20 | 0.55 | 0.45 | 1.00 | 8 | 0.60 |
| | 4 | A-4 | 0.89 | 0.11 | 0.93 | 0.07 | 0.2 | 0.35 | 0.35 | 0.65 | 1.00 | 2 | 0.45 |
| | 5 | A-5 | 0.88 | 0.12 | 0.99 | 0.01 | 0.05 | 0.38 | 0.40 | 0.60 | 1.00 | 9.5 | 0.41 |
| | 6 | A-6 | 0.87 | 0.13 | 0.90 | 0.10 | 0.5 | 0.29 | 0.55 | 0.45 | 1.00 | 5 | 0.40 |
| | 7 | A-7 | 0.86 | 0.14 | 0.96 | 0.04 | 0.1 | 0.31 | 0.50 | 0.50 | 1.00 | 15 | 0.58 |
| | 8 | A-8 | 0.84 | 0.16 | 0.99 | 0.01 | 0.4 | 0.39 | 0.45 | 0.55 | 1.00 | 4 | 0.42 |
| | 9 | A-9 | 0.82 | 0.18 | 0.98 | 0.02 | 0.05 | 0.33 | 0.40 | 0.60 | 1.00 | 3 | 0.53 |
| | 10 | A-10 | 0.80 | 0.20 | 0.99 | 0.01 | 0.3 | 0.37 | 0.35 | 0.65 | 1.00 | 10 | 0.59 |

TABLE 4

| | | Cemented Carbide Substrate No. | Crystal Orientation Hysteresis Layer ((Ti, Al)NC layer) | | | | | Hard Coating Layer ((Ti, Al)N layer) | | | | |
|---|---|---|---|---|---|---|---|---|---|---|---|---|
| | | | Designated Composition (atomic ratio) | | | | Designated Thickness (μm) | FWHM at (200) plane (degree) | Designated Composition (atomic ratio) | | | Designated Thickness (μm) | FWHM at (200) plane (degree) |
| TYPE | | | Ti | Al | N | C | | | Ti | Al | N | | |
| CUTTING INSERT OF THE PRESENT INVENTION | 11 | B-1 | 0.95 | 0.05 | 0.93 | 0.07 | 0.2 | 0.36 | 0.45 | 0.55 | 1.00 | 12 | 0.43 |
| | 12 | B-2 | 0.93 | 0.07 | 0.87 | 0.13 | 0.1 | 0.40 | 0.50 | 0.50 | 1.00 | 5 | 0.52 |
| | 13 | B-3 | 0.91 | 0.09 | 0.95 | 0.05 | 0.05 | 0.43 | 0.55 | 0.45 | 1.00 | 3 | 0.46 |
| | 14 | B-4 | 0.89 | 0.11 | 0.85 | 0.15 | 0.2 | 0.30 | 0.35 | 0.65 | 1.00 | 7.5 | 0.38 |
| | 15 | B-5 | 0.88 | 0.12 | 0.91 | 0.09 | 0.1 | 0.48 | 0.40 | 0.60 | 1.00 | 8 | 0.59 |
| | 16 | B-6 | 0.87 | 0.13 | 0.97 | 0.03 | 0.3 | 0.28 | 0.55 | 0.45 | 1.00 | 2 | 0.54 |
| | 17 | B-1 | 0.86 | 0.14 | 0.94 | 0.06 | 0.05 | 0.24 | 0.50 | 0.50 | 1.00 | 7 | 0.49 |
| | 18 | B-3 | 0.84 | 0.16 | 0.88 | 0.12 | 0.3 | 0.38 | 0.45 | 0.55 | 1.00 | 4.5 | 0.59 |
| | 19 | B-4 | 0.82 | 0.18 | 0.86 | 0.14 | 0.1 | 0.32 | 0.40 | 0.60 | 1.00 | 4 | 0.57 |
| | 20 | B-6 | 0.80 | 0.20 | 0.92 | 0.08 | 0.5 | 0.31 | 0.35 | 0.65 | 1.00 | 14 | 0.39 |

TABLE 5

| | | Cemented Carbide Substrate | Crystal Orientation Hysteresis Layer ((Ti, Al)NC layer) | | | | | | Hard Coating Layer ((Ti, Al)N layer) | | | | |
|---|---|---|---|---|---|---|---|---|---|---|---|---|---|---|
| | | | Designated Composition (atomic ratio) | | | | Designated Thickness | FWHM at (200) plane | Designated Composition (atomic ratio) | | | Designated Thickness | FWHM at (200) plane |
| TYPE | | No. | Ti | Al | N | C | (μm) | (degree) | Ti | Al | N | (μm) | (degree) |
| CONVENTIONAL CUTTING INSERT | 1 | A-1 | — | — | — | — | — | — | 0.45 | 0.55 | 1.00 | 3 | 1.12 |
| | 2 | A-2 | — | — | — | — | — | — | 0.50 | 0.50 | 1.00 | 6.5 | 1.01 |
| | 3 | A-3 | — | — | — | — | — | — | 0.55 | 0.45 | 1.00 | 8 | 1.30 |
| | 4 | A-4 | — | — | — | — | — | — | 0.35 | 0.65 | 1.00 | 2 | 0.95 |
| | 5 | A-5 | — | — | — | — | — | — | 0.40 | 0.60 | 1.00 | 9.5 | 1.35 |
| | 6 | A-6 | — | — | — | — | — | — | 0.55 | 0.45 | 1.00 | 5 | 0.90 |
| | 7 | A-7 | — | — | — | — | — | — | 0.50 | 0.50 | 1.00 | 15 | 1.35 |
| | 8 | A-8 | — | — | — | — | — | — | 0.45 | 0.55 | 1.00 | 4 | 1.29 |
| | 9 | A-9 | — | — | — | — | — | — | 0.40 | 0.60 | 1.00 | 3 | 1.02 |
| | 10 | A-10 | — | — | — | — | — | — | 0.35 | 0.65 | 1.00 | 10 | 1.41 |

TABLE 6

| | | Cemented Carbide Substrate | Crystal Orientation Hysteresis Layer ((Ti, Al)NC layer) | | | | | | Hard Coating Layer ((Ti, Al)N layer) | | | | |
|---|---|---|---|---|---|---|---|---|---|---|---|---|---|---|
| | | | Designated Composition (atomic ratio) | | | | Designated Thickness | FWHM at (200) plane | Designated Composition (atomic ratio) | | | Designated Thickness | FWHM at (200) plane |
| TYPE | | No. | Ti | Al | N | C | (μm) | (degree) | Ti | Al | N | (μm) | (degree) |
| CONVENTIONAL CUTTING INSERT | 11 | B-1 | — | — | — | — | — | — | 0.45 | 0.55 | 1.00 | 12 | 0.98 |
| | 12 | B-2 | — | — | — | — | — | — | 0.50 | 0.50 | 1.00 | 5 | 1.23 |
| | 13 | B-3 | — | — | — | — | — | — | 0.55 | 0.45 | 1.00 | 3 | 1.40 |
| | 14 | B-4 | — | — | — | — | — | — | 0.35 | 0.65 | 1.00 | 7.5 | 1.18 |
| | 15 | B-5 | — | — | — | — | — | — | 0.40 | 0.60 | 1.00 | 8 | 0.96 |
| | 16 | B-6 | — | — | — | — | — | — | 0.55 | 0.45 | 1.00 | 2 | 1.31 |
| | 17 | B-1 | — | — | — | — | — | — | 0.50 | 0.50 | 1.00 | 7 | 1.24 |
| | 18 | B-3 | — | — | — | — | — | — | 0.45 | 0.55 | 1.00 | 4.5 | 1.20 |
| | 19 | B-4 | — | — | — | — | — | — | 0.40 | 0.60 | 1.00 | 4 | 1.48 |
| | 20 | B-6 | — | — | — | — | — | — | 0.35 | 0.65 | 1.00 | 14 | 1.42 |

TABLE 7

| | | Flank Wear Width (mm) | | |
|---|---|---|---|---|
| TYPE | | high-speed, continuous turning of alloyed steel | high-speed, interrupted turning of carbon steel | high-speed, interrupted turning of cast iron |
| CUTTING INSERT OF THE PRESENT INVENTION | 1 | 0.14 | 0.16 | 0.19 |
| | 2 | 0.09 | 0.20 | 0.18 |
| | 3 | 0.11 | 0.19 | 0.20 |
| | 4 | 0.10 | 0.19 | 0.24 |
| | 5 | 0.15 | 0.14 | 0.23 |
| | 6 | 0.10 | 0.15 | 0.18 |
| | 7 | 0.08 | 0.17 | 0.21 |
| | 8 | 0.15 | 0.18 | 0.19 |
| | 9 | 0.08 | 0.16 | 0.23 |
| | 10 | 0.13 | 0.18 | 0.24 |
| CONVENTIONAL CUTTING INSERT | 1 | 0.68 | 0.77 | 0.82 |
| | 2 | 0.57 | 0.94 | 0.74 |
| | 3 | 0.80 | 0.67 | 0.80 |
| | 4 | 0.88 | 0.72 | 0.72 |
| | 5 | 0.79 | 0.90 | 0.92 |
| | 6 | 0.64 | 0.74 | 0.77 |
| | 7 | 0.70 | 0.80 | 0.94 |
| | 8 | 0.75 | 0.68 | 0.83 |
| | 9 | 0.80 | 0.81 | 0.77 |
| | 10 | 0.80 | 0.80 | 0.85 |

TABLE 8

| | | Flank Wear Width (mm) | | |
|---|---|---|---|---|
| TYPE | | high-speed, continuous turning of alloyed steel | high-speed, interrupted turning of carbon steel | high-speed, interrupted turning of cast iron |
| CUTTING INSERT OF THE PRESENT INVENTION | 11 | 0.11 | 0.15 | 0.25 |
| | 12 | 0.13 | 0.15 | 0.20 |
| | 13 | 0.09 | 0.16 | 0.25 |
| | 14 | 0.07 | 0.14 | 0.22 |
| | 15 | 0.08 | 0.14 | 0.22 |
| | 16 | 0.10 | 0.17 | 0.21 |
| | 17 | 0.12 | 0.20 | 0.19 |
| | 18 | 0.13 | 0.14 | 0.18 |
| | 19 | 0.16 | 0.17 | 0.18 |
| | 20 | 0.09 | 0.20 | 0.20 |
| CONVENTIONAL CUTTING INSERT | 11 | 0.62 | 0.92 | 0.73 |
| | 12 | 0.56 | 0.64 | 0.75 |
| | 13 | 0.79 | 0.76 | 0.64 |
| | 14 | 0.64 | 0.71 | 0.70 |
| | 15 | 0.70 | 0.87 | 0.96 |
| | 16 | 0.80 | 0.68 | 0.86 |
| | 17 | 0.83 | 0.68 | 0.89 |
| | 18 | 0.54 | 0.83 | 0.98 |
| | 19 | 0.69 | 0.77 | 0.87 |
| | 20 | 0.66 | 0.90 | 0.69 |

EXAMPLE 2

Ingredient powders, i.e., middle coarse grain WC powder having 5.5 μm for the average particle diameter, fine WC powder having 0.8 μm for the average particle diameter, TaC powder having 1.3 μm for the average particle diameter, NbC powder having 1.2 μm for the average particle diameter, ZrC powder having 1.2 μm for the average particle diameter, $Cr_3C_2$ powder having 2.3 μm for the average particle diameter, VC powder having 1.5 μm for the average particle diameter, (Ti,W)C powder having 1.0 μm for the average particle diameter, Co powder having 1.8 μm for the average particle diameter were prepared and mixed in accordance with compounding ratios as presented in TABLE 9. Furthermore, wax was added to the ingredient powders and these were mixed in acetone using a ball mill for 24 hours, dried under a reduced pressure, and were compacted under pressure of 100 MPa so as to form a green compact. The green compact was heated up to a predetermined temperature in a range from 1370 to 1470° C. at a rate of 7° C./min. under a pressure of 6 Pa and held at this temperature for 1 hour so as to be sintered. After that, it was cooled in the condition of a furnace cooling so that a sintered compact was formed. In this way, three types of the sintered compact were made as round bars each having a diameter of 8 mm, 13 mm, and 26 mm, respectively, for making cemented carbide substrate. These three types of sintered compact as round bar were subjected further to a grinding work so that cemented carbide substrates (end mills) from "a" to "h" were made. Here, each substrate has dimensions, i.e., the diameter and the length, of the part of the cutting edge of 6 mm×13 mm, 10 mm×22 mm, and 20 mm×45 mm, respectively, as presented in TABLE 9.

Figure 7A:
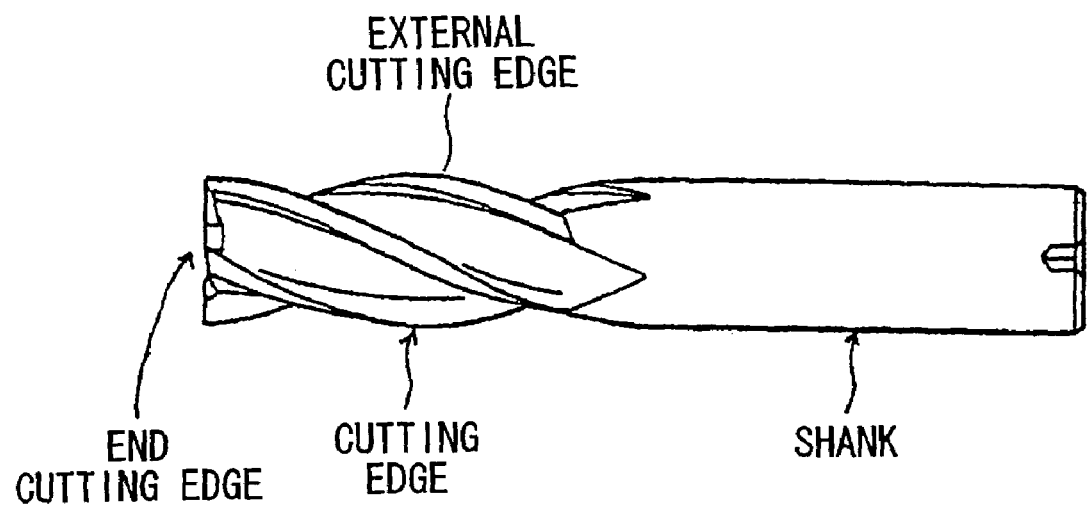
FIG. 7A shows a side view of a coated end mill, and FIG. 7B a cross-sectional view of the cutting edge of the coated end mill.
Figure 7B:
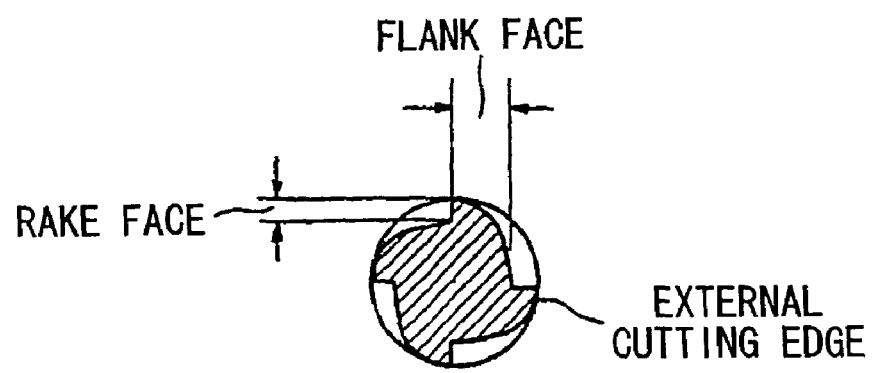

Next, these cemented carbide substrates (end mills) a-h were subjected to ultrasonic cleaning in an acetone solvent, were dried, and set in an ordinary arc ion plating apparatus as shown in FIG. 5, respectively. Then, the crystal orientation hysteresis layer (the (Ti, Al)NC layer) and the hard coating layer ((Ti, Al)N layer) having the designated composition and thickness, which are presented in TABLE 10, were formed on the surface of the cemented carbide substrates by vapor deposition under the same condition as for Example 1, respectively. In this way, end mill made of cemented carbide with surface coating of the present invention 1–8 (hereinafter referred to as a coated cemented carbide end mill of the present invention) having a geometrical configuration as shown in FIG. 7A as a perspective view and in FIG. 7B as a cross-sectional view were manufactured as coated cemented carbide tools of the present invention.

Moreover, conventional end mills made of cemented carbide with surface coating 1–8 (hereinafter referred as a conventional coated cemented carbide end mill) as conventional coated cemented carbide tools were made as control samples, as presented in TABLE 11, which are configured as with the end mills of the present invention excepting that the crystal orientation hysteresis layer ((Ti, Al)NC layer) is not formed.

Next, the coated cemented carbide end mills of the present invention 1–8 and the conventional coated cemented carbide end mills 1–8 were subjected to a high-speed, dry, slotting operation test. The detailed test conditions were set as follows:

for a test of high-speed, dry, slotting of alloyed steel using the coated cemented carbide end mills of the present invention 1–3 and the conventional coated cemented carbide end mills 1–3;

workpiece: JIS-SNCM439 plate having plane-size of 100 mm×250 mm and thickness of 50 mm;

cutting speed: 150 m/min.;

depth of the groove (depth of cutting): 3 mm;

table-feed: 650 mm/min.;

for a test of high-speed, dry, slotting of carbon steel using the coated cemented carbide end mills of the present invention 4–6 and the conventional coated cemented carbide end mills 4–6;

workpiece: JIS-S55C plate having plane-size of 100 mm×250 mm and thickness of 50 mm;

cutting speed: 160 m/min.;

depth of the groove (depth of cutting): 5 mm;

table-feed: 600 mm/min.;

for a test of high-speed, dry, slotting of cast iron using the coated cemented carbide end mills of the present invention 7 and 8 and the conventional coated cemented carbide end mills 7 and 8;

workpiece: JIS-FC250 plate having plane-size of 100 mm×250 mm and thickness of 50 mm;

cutting speed: 160 m/min.;

depth of the groove (depth of cutting): 10 mm;

table-feed: 320 mm/min.

In all slotting tests, the cut groove length was measured; when the flank of the peripheral cutting edge is worn away by 0.1 mm, this is a guide for the end of the usual tool life. These results of the measurements are shown in TABLES 10 and 11, respectively.

TABLE 9

| | TYPE | | Co | (Ti, W)C | TaC | NbC | ZrC | $Cr_3C_2$ | VC | WC | diameter × length of the cutting edge (mm) |
|---|---|---|---|---|---|---|---|---|---|---|---|
| CEMENTED CARBIDE SUBSTRATE (END MILL) | a | | 5 | 5 | — | — | — | — | — | middle, coarse grain: balance | 6 × 13 |
| | b | | 6 | — | 1 | 0.5 | — | — | — | fine grain: balance | 6 × 13 |
| | c | | 6 | — | 1 | — | 1 | 0.5 | 0.5 | fine grain: balance | 6 × 13 |
| | d | | 8 | — | — | — | — | 0.5 | 0.5 | fine grain: balance | 10 × 22 |
| | e | | 9 | 25 | 10 | 1 | — | — | — | middle, coarse grain: balance | 10 × 22 |

COMPOSITION (wt. %)

TABLE 9-continued

| | | COMPOSITION (wt. %) | | | | | | | diameter × length of the cutting edge |
|---|---|---|---|---|---|---|---|---|---|
| TYPE | | Co | (Ti, W)C | TaC | NbC | ZrC | Cr$_3$C$_2$ | VC WC | (mm) |
| | f | 10 | — | — | — | — | 1 | — fine grain: balance | 10 × 22 |
| | g | 12 | 17 | 9 | 1 | — | — | — middle, coarse grain: balance | 20 × 45 |
| | h | 16 | — | 10 | 5 | 10 | — | — middle, coarse grain: balance | 20 × 45 |

TABLE 10

| | | Cemented Carbide Substrate | Crystal Orientation Hysteresis Layer ((Ti, Al)NC layer) | | | | |
|---|---|---|---|---|---|---|---|
| | | | Designated Composition (atomic ratio) | | | Designated Thickness | FWHM at (200) plane |
| TYPE | | No. | Ti | Al | N | C | (μm) | (degree) |
| END MILL | 1 | a | 0.94 | 0.06 | 0.97 | 0.03 | 0.1 | 0.43 |
| OF THE | 2 | b | 0.91 | 0.09 | 0.99 | 0.01 | 0.4 | 0.32 |
| PRESENT | 3 | c | 0.90 | 0.10 | 0.95 | 0.05 | 0.2 | 0.39 |
| INVENTION | 4 | d | 0.88 | 0.12 | 0.93 | 0.07 | 0.1 | 0.25 |
| | 5 | e | 0.86 | 0.14 | 0.86 | 0.14 | 0.5 | 0.35 |
| | 6 | f | 0.83 | 0.17 | 0.85 | 0.15 | 0.1 | 0.37 |
| | 7 | g | 0.81 | 0.19 | 0.89 | 0.01 | 0.05 | 0.29 |
| | 8 | h | 0.80 | 0.20 | 0.91 | 0.09 | 0.3 | 0.40 |

| | | Hard Coating Layer ((Ti, Al)N Layer) | | | | | |
|---|---|---|---|---|---|---|---|
| | | Designated Composition (atomic ratio) | | | Designated Thickness | FWHM at (200) plane | cutting |
| TYPE | | Ti | Al | N | (μm) | (degree) | length (m) |
| END MILL | 1 | 0.45 | 0.55 | 1.00 | 4 | 0.60 | 160 |
| OF THE | 2 | 0.40 | 0.60 | 1.00 | 7 | 0.54 | 170 |
| PRESENT | 3 | 0.55 | 0.45 | 1.00 | 2 | 0.48 | 140 |
| INVENTION | 4 | 0.50 | 0.50 | 1.00 | 3 | 0.42 | 180 |
| | 5 | 0.50 | 0.50 | 1.00 | 9 | 0.56 | 175 |
| | 6 | 0.55 | 0.45 | 1.00 | 2.5 | 0.48 | 180 |
| | 7 | 0.35 | 0.65 | 1.00 | 15 | 0.40 | 100 |
| | 8 | 0.45 | 0.55 | 1.00 | 4.5 | 0.46 | 110 |

TABLE 11

| | | Cemented Carbide Substrate | Crystal Orientation Hysteresis Layer ((Ti, Al)NC layer) | | | | | |
|---|---|---|---|---|---|---|---|---|
| | | | Designated Composition (atomic ratio) | | | | Designated Thickness | FWHM at (200) plane |
| TYPE | | No. | Ti | Al | N | C | (μm) | degree |
| CONVENTIONAL | 1 | a | — | — | — | — | — | — |
| END MILL | 2 | b | — | — | — | — | — | — |
| | 3 | c | — | — | — | — | — | — |
| | 4 | d | — | — | — | — | — | — |
| | 5 | e | — | — | — | — | — | — |

TABLE 11-continued

| | | | | | | | |
|---|---|---|---|---|---|---|---|
| | 6 | f | — | — | — | — | — | — |
| | 7 | g | — | — | — | — | — | — |
| | 8 | h | — | — | — | — | — | — |

| | | Hard Coating Layer ((Ti, Al)N layer) | | | | | |
|---|---|---|---|---|---|---|---|
| | | Designated Composition (atomic ratio) | | | Designated Thickness | FWHM at (200) plane | cutting length |
| TYPE | | Ti | Al | N | (μm) | (degree) | (m) |
| CONVENTIONAL | 1 | 0.45 | 0.55 | 1.00 | 4 | 0.99 | 40 |
| END MILL | 2 | 0.40 | 0.60 | 1.00 | 7 | 1.29 | 40 |
| | 3 | 0.55 | 0.45 | 1.00 | 2 | 1.12 | 45 |
| | 4 | 0.50 | 0.50 | 1.00 | 3 | 0.90 | 55 |
| | 5 | 0.50 | 0.50 | 1.00 | 9 | 1.20 | 50 |
| | 6 | 0.55 | 0.45 | 1.00 | 2.5 | 1.38 | 60 |
| | 7 | 0.35 | 0.65 | 1.00 | 1.5 | 0.93 | 25 |
| | 8 | 0.45 | 0.55 | 1.00 | 1.5 | 1.42 | 20 |

EXAMPLE 3

The three types of sintered round rod each having a diameter of 8 mm (for cemented carbide substrates a–c), 13 mm (for cemented carbide substrates d–f), and 26 mm (for cemented carbide substrate g, h), respectively, which were made through the process as described in Example 2, were used again and further subjected to a grinding work so that cemented carbide substrates (twist drills) from "a'" to "h'" were made in which each substrate has dimensions, i.e., the diameter and the length, of 4 mm×13 mm (cemented carbide substrates a'–c'), 8 mm×22 mm (cemented carbide substrates d'–f'), and 16 mm×45 mm (cemented carbide substrates g', h'), respectively.

Figure 8A:
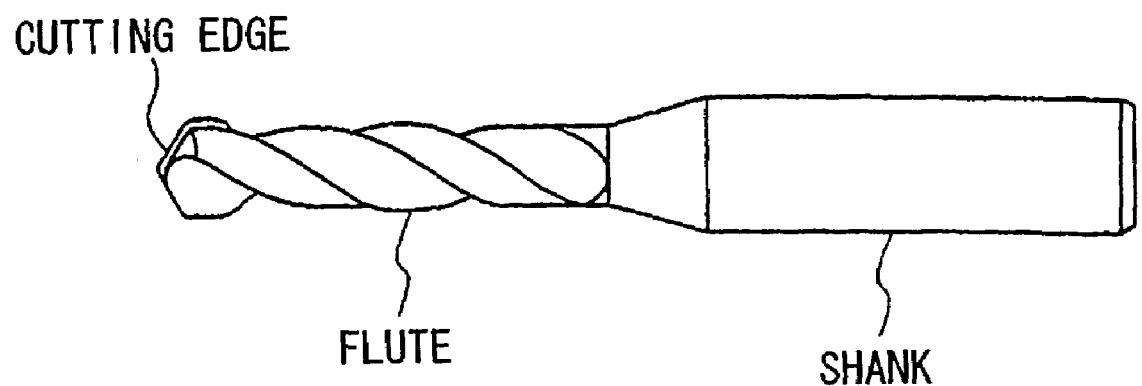
FIG. 8A shows a side view of a coated drill, and FIG. 8B a cross-sectional view of the flute of the coated drill.
Figure 8B:
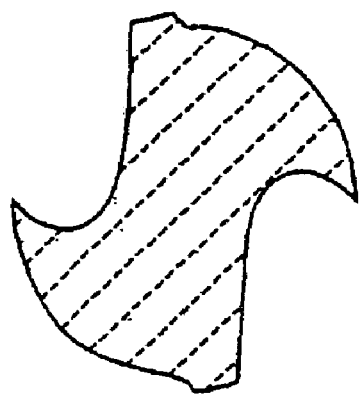

Next, these cemented carbide substrates (twist drills) a'–h' were subjected to ultrasonic cleaning in an acetone solvent for the surface, were dried, and set in an ordinary arc ion plating apparatus as shown in FIG. 5, respectively. Then, the crystal orientation hysteresis layer (the (Ti, Al)NC layer) and the hard coating layer ((Ti, Al)N layer) having the designated composition and thickness, which are presented in TABLE 12, were formed on the surface of the cemented carbide substrates by vapor deposition under the same condition as for Example 1, respectively. In this way, drills made of cemented carbide with surface coating of the present invention 1–8 (hereinafter referred to as a coated cemented carbide drill of the present invention) having a geometrical configuration as shown in FIG. 8A as a perspective view and in FIG. 8B as a cross-sectional view were manufactured as coated cemented carbide tools of the present invention.

Moreover, conventional drills made of cemented carbide with surface coatings 1–8 (hereinafter referred as a conventional coated cemented carbide drill) as conventional coated cemented carbide tools were made as control samples, as presented in TABLE 13, which are configured as with the drills of the present invention excepting that the crystal orientation hysteresis layer ((Ti, Al)NC layer) is not formed.

Next, the coated cemented carbide drills of the present invention 1–8 and the conventional coated cemented carbide drills 1–8 were subjected to a high-speed, wet, drilling operation test in which a blind hole with 2.5 times the diameter of the drill-diameter was drilled. The detailed test conditions were set as follows:

for a test of high-speed, wet, drilling of alloyed steel using the coated cemented carbide drills of the present invention 1–3 and the conventional coated cemented carbide drills 1–3;

workpiece: JIS-SCM440 plate having plane-size of 100 mm×250 mm and thickness of 50 mm;

cutting speed: 100 m/min.;

feed: 0.12 mm/rev.;

for a test of high-speed, wet, boring of carbon steel using the coated cemented carbide drills of the present invention 4–6 and the conventional coated cemented carbide drills 4–6;

workpiece: JIS-S50C plate having plane-size of 100 mm×250 mm and thickness of 50 mm;

cutting speed: 120 m/min.;

feed: 0.25 mm/rev.;

for a test of high-speed, wet, boring of cast iron using the coated cemented carbide drills of the present invention 7 and 8 and the conventional coated cemented carbide drills 7 and 8;

workpiece: JIS-FC300 plate having plane-size of 100 mm×250 mm and thickness of 50 mm;

cutting speed: 90 m/min.;

feed: 0.27 mm/rev.;

In all high-speed, wet, boring tests, the numbers of drilled holes were measured when the flank wear width of the cutting edge came down to 0.3 mm. These results of the measurements are shown in TABLES 12 and 13, respectively.

TABLE 12

| | | Cemented Carbide Substrate | Crystal Orientation Hysteresis Layer ((Ti, Al)NC layer) | | | | | |
|---|---|---|---|---|---|---|---|---|
| | | | Designated Composition (atomic ratio) | | | | Designated Thickness | FWHM at (200) plane |
| TYPE | | No. | Ti | Al | N | C | (μm) | (degree) |
| DRILL OF THE PRESENT INVENTION | 1 | a' | 0.95 | 0.05 | 0.97 | 0.03 | 0.5 | 0.23 |
| | 2 | b' | 0.93 | 0.07 | 0.90 | 0.10 | 0.4 | 0.45 |
| | 3 | c' | 0.91 | 0.09 | 0.94 | 0.06 | 0.3 | 0.38 |
| | 4 | d' | 0.88 | 0.12 | 0.89 | 0.11 | 0.05 | 0.29 |
| | 5 | e' | 0.86 | 0.14 | 0.99 | 0.01 | 0.2 | 0.45 |
| | 6 | f' | 0.83 | 0.17 | 0.87 | 0.13 | 0.4 | 0.42 |
| | 7 | g' | 0.82 | 0.18 | 0.92 | 0.08 | 0.4 | 0.33 |
| | 8 | h' | 0.80 | 0.20 | 0.85 | 0.15 | 0.5 | 0.40 |

| | | Hard Coating Layer ((Ti, Al)N Layer) | | | | | |
|---|---|---|---|---|---|---|---|
| | | Designated Composition (atomic ratio) | | | Designated Thickness | FWHM at (200) plane | number of |
| TYPE | | Ti | Al | N | (μm) | (degree) | holes |
| DRILL OF THE PRESENT INVENTION | 1 | 0.45 | 0.55 | 1.00 | 15 | 0.45 | 6500 |
| | 2 | 0.55 | 0.45 | 1.00 | 2 | 0.42 | 5500 |
| | 3 | 0.35 | 0.65 | 1.00 | 10 | 0.48 | 7000 |
| | 4 | 0.45 | 0.55 | 1.00 | 12 | 0.53 | 10000 |
| | 5 | 0.40 | 0.60 | 1.00 | 8 | 0.58 | 11000 |
| | 6 | 0.50 | 0.50 | 1.00 | 10 | 0.60 | 9500 |
| | 7 | 0.55 | 0.45 | 1.00 | 9 | 0.53 | 2500 |
| | 8 | 0.35 | 0.65 | 1.00 | 5 | 0.51 | 3200 |

TABLE 13

| | | Cemented Carbide Substrate | Crystal Orientation Hysteresis Layer ((Ti, Al)NC layer) | | | | | |
|---|---|---|---|---|---|---|---|---|
| | | | Designated Composition (atomic ratio) | | | | Designated Thickness | FWHM at (200) plane |
| TYPE | | No. | Ti | Al | N | C | (μm) | (degree) |
| CONVENTIONAL DRILL | 1 | a' | — | — | — | — | — | — |
| | 2 | b' | — | — | — | — | — | — |
| | 3 | c' | — | — | — | — | — | — |
| | 4 | d' | — | — | — | — | — | — |
| | 5 | e' | — | — | — | — | — | — |
| | 6 | f' | — | — | — | — | — | — |
| | 7 | g' | — | — | — | — | — | — |
| | 8 | h' | — | — | — | — | — | — |

| | | Hard Coating Layer ((Ti, Al)N layer) | | | | | |
|---|---|---|---|---|---|---|---|
| | | Designated Composition (atomic ratio) | | | Designated Thickness | FWHM at (200) plane | number of |
| TYPE | | Ti | Al | N | (μm) | (degree) | holes |
| CONVENTIONAL DRILL | 1 | 0.45 | 0.55 | 1.00 | 15 | 1.42 | 3000 |
| | 2 | 0.55 | 0.45 | 1.00 | 2 | 0.92 | 2500 |
| | 3 | 0.35 | 0.65 | 1.00 | 10 | 1.03 | 3800 |
| | 4 | 0.45 | 0.55 | 1.00 | 12 | 1.29 | 4800 |
| | 5 | 0.40 | 0.60 | 1.00 | 8 | 1.33 | 6000 |
| | 6 | 0.50 | 0.50 | 1.00 | 10 | 0.98 | 5500 |
| | 7 | 0.55 | 0.45 | 1.00 | 9 | 1.22 | 800 |
| | 8 | 0.35 | 0.65 | 1.00 | 5 | 1.18 | 1200 |

Incidentally, the compositions of the above-mentioned layers, i.e., the crystal orientation hysteresis layer ((Ti, Al)NC layer) and the hard coating layer ((Ti, Al)N layer) on the coated cemented carbide inserts of the present invention 1–20, the coated cemented carbide end mills of the present invention 1–8 and the coated cemented carbide drills of the present invention 1–8 as the coated cemented carbide tools of the present invention, as well as the hard coating layer ((Ti, Al)N layer) on the conventional coated cemented carbide inserts 1–20, the conventional coated cemented carbide end mills 1–8, and the conventional coated cemented carbide drills 1–8 as the conventional coated cemented carbide tools, were measured in the thickness direction at the center area by using Auger Electron Spectral analysis equipment. The results of these measurements indicated that the composition of the layers was substantially the same as the designated value.

Also, cross sectional measurements of the thickness of the layers formed on the coated cemented carbide tools of the present invention and the conventional coated cemented carbide tools were done by using a scanning electron microscope. Then, the average thickness (the average of 5 points measurements) was indicated with the same value substantially as the designated thickness.

Moreover, the layers formed on the coated cemented carbide tools of the present invention and the conventional coated cemented carbide tools were inspected at the face and/or the flank of the cutting edge using an X-ray diffractometer. Through these inspections, FWHM of the peak at the (200) plane in the X-ray diffraction pattern was determined (here, when it was difficult to measure the tools itself, the sample pieces for measurement, which were set in the arc ion plating apparatus at the time of manufacturing the tools, were inspected and the X-ray diffraction pattern thereof was used to determine FWHM of the peak). These results are shown in TABLES 3–6 and TABLES 10–13.

The experimental results which are presented in TABLES 3–13 obviously show the following: The coated cemented carbide tool of the present invention on which the hard coating layer having a peak of a narrow FWHM at the (200) plane due to the existence of the crystal orientation hysteresis layer and so having excellent heat resistance (i.e., resistance to oxidation and hardness at high temperature) exhibits an excellent wear resistance even in cutting operations not only of steels but also of cast irons accompanied by high heat generation: This is because both of the increase of the heat resistance and the improvement of the adhesion between the hard coating layer and the cemented carbide substrate surface due to the C component in the crystal orientation hysteresis layer provide a synergetic effect; As opposed to this, with regard to the conventional coated cemented carbide tool in which the degree of crystallinity at the (200) plane of the hard coating layer is low, abrasion proceeds rapidly and the operating life reaches an end in a short time when it is used in high-speed cutting operation accompanied by high heat generation.

As described above, the coated cemented carbide tool according to the first embodiment has an excellent wear resistance even in high-speed cutting operations on various steels and cast irons, and exhibits outstanding ability for cutting so that it sufficiently meets the requirements that cutting apparatus should have high performance, and that cutting operations should be performed with less power, less energy and low cost.

In the following, a coated cemented carbide tool according to the second embodiment of the present invention will be explained based on examples.

EXAMPLE 4

Ingredient powders, i.e., WC powder, TiC powder, ZrC powder, VC powder, TaC powder, NbC powder, $Cr_3C_2$ powder, TiN powder, TaN powder, and Co powder, all of which have an average grain size in a range from 1 to 3 µm, were prepared and mixed in accordance with compounding ratios as presented in TABLE 14. The ingredient powders were mixed under wet conditions using a ball mill for 72 hours, were dried, and were compacted under pressure of 100 MPa so as to form a green compact. The green compact was held in a vacuum (pressure of 6 Pa) at a predetermined temperature of 1400° C. for 1 hour so as to be sintered. After sintering, the honing of R: 0.03 is given to the part of the cutting edge so that cemented carbide substrates made from the WC base cemented carbide A1–A10 meeting ISO CNMG120408 geometrical configuration of insert were made respectively.

Also, ingredient powders, i.e., TiCN (wherein TiC/TiN=50/50 by mass ratio) powder, $Mo_2C$ powder, ZrC powder, NbC powder, TaC powder, WC powder, Co powder, and Ni powder, all of which have an average grain size in a range from 0.5 to 2 µm, were prepared and mixed in accordance with compounding ratios as shown in TABLE 15. The ingredient powders were mixed under wet conditions using a ball mill for 24 hours, were dried, and were compacted under pressure of 100 MPa so as to form a green compact. The green compact was held in a nitrogen atmosphere (pressure of 2 kPa) at a predetermined temperature of 1500° C. for 1 hour so as to be sintered. After sintering, the honing of R: 0.03 is given to the part of the cutting edge so that cemented carbide substrates made from the TiCN based cermet B1–B6 meeting ISO CNMG120408 geometrical configuration of insert were made respectively.

Next, these cemented carbide substrates A1–A10 and B1–B6 were subjected to ultrasonic cleaning in an acetone solvent, were dried, and set in an ordinary arc ion plating apparatus as shown in FIG. 5, respectively. Meanwhile, the Al—Ti—Si alloys for the hard coating layer and the Ti—Al alloys for the crystal orientation hysteresis layer having various compositions were set to form the cathode (evaporation source), and the inside of the apparatus is evacuated to keep 0.5 Pa and heated to 500° C. by the heater. Then, Ar was introduced in the apparatus to make the Ar atmosphere of 1.3 Pa. Under this condition, the DC bias voltage of −800V was applied to the cemented carbide substrate, and the surface of the substrate was cleaned by Ar bombardment. Next, while introducing mixed gas of nitrogen gas and methane gas at a predetermined mixture ratio as reaction gas in the apparatus and setting to a reaction pressure of 3.5 Pa, the bias voltage applied to the above-mentioned substrate was lowered to −70 V, and the arc discharge was generated between the above-mentioned cathode (Ti—Al alloy for the crystal orientation hysteresis layer) and the anode. Then, the crystal orientation hysteresis layer (the (Ti, Al)NC layer) having the designated composition and thickness, which is shown in TABLES 16 and 17, was formed on the surface of the cemented carbide substrates A1–A10 and B1–B6, respectively. For the next step, while introducing nitrogen gas as reaction gas in the apparatus and setting to a reaction pressure of 2.7 Pa, the bias voltage applied to the above-mentioned substrate was lowered to −50 V, and the arc discharge was generated between the above-mentioned cathode (Al—Ti—Si alloy for the hard coating layer) and the anode so that the hard coating layer ((Al, Ti, Si)N layer) having the designated composition and thickness, which is shown in TABLES 16 and 17, was formed by vapor deposition. In this way, indexable type inserts made of cemented carbide with surface coating of the present invention 1–20 (hereinafter referred to as a coated cemented carbide inserts of the present invention) having a geometrical configuration as shown in FIG. 6A as a perspective view and in FIG. 6B as a cross-sectional view were manufactured as coated cemented carbide tools of the present invention.

Moreover, conventional indexable type inserts made of cemented carbide with surface coating 1–20 (hereinafter referred as a conventional coated cemented carbide insert) as conventional coated cemented carbide tools were made as control samples as presented in TABLES 18 and 19, which are configured as with the inserts of the present invention excepting that the crystal orientation hysteresis layer ((Ti, Al)NC layer) is not formed.

Next, the coated cemented carbide inserts of the present invention 1–20 and the conventional coated cemented carbide inserts 1–20 were subjected to a high-speed, dry, turning operation test, by screw setting these inserts at the top of the cutting tool made of a tool steel. The detailed test conditions were set as follows:

for a test of high-speed, dry, continuous turning of alloyed steel;
    workpiece: JIS (Japanese Industrial Standard) SCM440 round bar;
    cutting speed: 330 m/min.;
    depth of cutting: 1.3 mm;
    feed: 0.5 mm/rev.; and
    time: 15 min.;

for a test of high-speed, dry, interrupted turning of carbon steel;
    workpiece: JIS S45C round bar with four flutes evenly spaced in the direction of the length;
    cutting speed: 300 m/min.;
    depth of cutting: 1.8 mm;
    feed: 0.5 mm/rev.; and
    time: 18 min.;

for a test of high-speed, dry, interrupted turning of cast iron;
    workpiece: JIS FC300 round bar with four flutes evenly spaced in the direction of the length;
    cutting speed: 380 m/min.;
    depth of cutting: 1.3 mm;
    feed: 0.3 mm/rev.; and
    time: 30 min.;

The flank wear of the cutting edge was measured in each test. These results of the measurements are shown in TABLE 20.

TABLE 14

| TYPE | | Co | TiC | ZrC | VC | TaC | NbC | $Cr_3C_2$ | TiN | TaN | WC |
|---|---|---|---|---|---|---|---|---|---|---|---|
| CEMENTED CARBIDE SUBSTRATE | A-1 | 10.5 | 8 | — | — | 8 | 1.5 | — | — | — | balance |
| | A-2 | 7 | — | — | — | — | — | — | — | — | balance |
| | A-3 | 5.7 | — | — | — | 1.5 | 0.5 | — | — | — | balance |
| | A-4 | 5.7 | — | — | — | — | — | 1 | — | — | balance |
| | A-5 | 8.5 | — | 0.5 | — | — | — | 0.5 | — | — | balance |
| | A-6 | 9 | — | — | — | 2.5 | 1 | — | — | — | balance |
| | A-7 | 9 | 8.5 | — | — | 8 | 3 | — | — | — | balance |
| | A-8 | 11 | 8 | — | — | 4.5 | — | — | 1.5 | — | balance |
| | A-9 | 12.5 | 2 | — | — | — | — | — | 1 | 2 | balance |
| | A-10 | 14 | — | — | 0.2 | — | — | 0.8 | — | — | balance |

TABLE 15

| TYPE | | Co | Ni | ZrC | TaC | NbC | $MO_2C$ | WC | TiCN |
|---|---|---|---|---|---|---|---|---|---|
| CEMENTED CARBIDE SUBSTRATE | B-1 | 13 | 5 | — | 10 | — | 10 | 16 | balance |
| | B-2 | 8 | 7 | — | 5 | — | 7.5 | — | balance |
| | B-3 | 5 | — | — | — | — | 6 | 10 | balance |
| | B-4 | 10 | 5 | — | 11 | 2 | — | — | balance |
| | B-5 | 9 | 4 | 1 | 8 | — | 10 | 10 | balance |
| | B-6 | 12 | 5.5 | — | 10 | — | 9.5 | 14.5 | balance |

TABLE 16

| | | Cemented Carbide Substrate | Crystal Orientation Hysteresis Layer ((Ti, Al)NC layer) | | | | | Hard Coating Layer ((Al, Ti, Si)N layer) | | | | | |
|---|---|---|---|---|---|---|---|---|---|---|---|---|---|
| | | | Designated Composition (atomic ratio) | | | | Designated Thickness | FWHM at (200) plane | Designated Composition (atomic ratio) | | | | Designated Thickness | FWHM at (200) plane |
| TYPE | | No. | Ti | Al | N | C | (μm) | (degree) | Al | Ti | Si | N | (μm) | (degree) |
| CUTTING INSERT OF THE PRESENT INVENTION | 1 | A-1 | 0.99 | 0.01 | 0.85 | 0.15 | 0.35 | 0.42 | 0.25 | 0.55 | 0.20 | 1.00 | 8.0 | 0.51 |
| | 2 | A-2 | 0.95 | 0.05 | 0.99 | 0.01 | 0.30 | 0.33 | 0.50 | 0.35 | 0.15 | 1.00 | 2.0 | 0.49 |
| | 3 | A-3 | 0.90 | 0.10 | 0.92 | 0.08 | 0.05 | 0.32 | 0.40 | 0.50 | 0.10 | 1.00 | 7.5 | 0.44 |
| | 4 | A-4 | 0.85 | 0.15 | 0.90 | 0.10 | 0.45 | 0.53 | 0.45 | 0.50 | 0.05 | 1.00 | 4.5 | 0.58 |
| | 5 | A-5 | 0.99 | 0.01 | 0.95 | 0.05 | 0.15 | 0.40 | 0.45 | 0.35 | 0.20 | 1.00 | 3.5 | 0.50 |
| | 6 | A-6 | 0.95 | 0.05 | 0.90 | 0.10 | 0.20 | 0.33 | 0.30 | 0.55 | 0.15 | 1.00 | 7.0 | 0.41 |
| | 7 | A-7 | 0.90 | 0.10 | 0.92 | 0.08 | 0.50 | 0.55 | 0.40 | 0.50 | 0.10 | 1.00 | 10.0 | 0.58 |
| | 8 | A-8 | 0.85 | 0.15 | 0.85 | 0.15 | 0.15 | 0.45 | 0.60 | 0.35 | 0.05 | 1.00 | 3.5 | 0.51 |
| | 9 | A-9 | 0.95 | 0.05 | 0.90 | 0.10 | 0.25 | 0.50 | 0.45 | 0.40 | 0.15 | 1.00 | 8.0 | 0.55 |
| | 10 | A-10 | 0.90 | 0.10 | 0.93 | 0.07 | 0.40 | 0.48 | 0.45 | 0.45 | 0.10 | 1.00 | 4.5 | 0.58 |

TABLE 17

| TYPE | | Cemented Carbide Substrate No. | Crystal Orientation Hysteresis Layer ((Ti, Al)NC layer) | | | | | | Hard Coating Layer ((Al, Ti, Si)N layer) | | | | | |
|---|---|---|---|---|---|---|---|---|---|---|---|---|---|---|
| | | | Designated Composition (atomic ratio) | | | | Designated Thickness (μm) | FWHM at (200) plane (degree) | Designated Composition (atomic ratio) | | | | Designated Thickness (μm) | FWHM at (200) plane (degree) |
| | | | Ti | Al | N | C | | | Al | Ti | Si | N | | |
| CUTTING | 11 | B-1 | 0.85 | 0.15 | 0.91 | 0.09 | 0.15 | 0.43 | 0.40 | 0.55 | 0.05 | 1.00 | 5.0 | 0.51 |
| INSERT | 12 | B-2 | 0.90 | 0.10 | 0.97 | 0.03 | 0.50 | 0.51 | 0.55 | 0.35 | 0.10 | 1.00 | 10.0 | 0.55 |
| OF THE | 13 | B-3 | 0.95 | 0.05 | 0.93 | 0.07 | 0.35 | 0.40 | 0.35 | 0.50 | 0.15 | 1.00 | 7.0 | 0.53 |
| PRESENT | 14 | B-4 | 0.99 | 0.01 | 0.85 | 0.15 | 0.25 | 0.45 | 0.30 | 0.50 | 0.20 | 1.00 | 2.5 | 0.56 |
| INVENTION | 15 | B-5 | 0.85 | 0.15 | 0.88 | 0.12 | 0.10 | 0.45 | 0.60 | 0.35 | 0.05 | 1.00 | 8.0 | 0.50 |
| | 16 | B-6 | 0.90 | 0.10 | 0.92 | 0.08 | 0.50 | 0.55 | 0.35 | 0.55 | 0.10 | 1.00 | 2.0 | 0.59 |
| | 17 | B-2 | 0.95 | 0.05 | 0.90 | 0.10 | 0.25 | 0.48 | 0.30 | 0.55 | 0.15 | 1.00 | 4.5 | 0.51 |
| | 18 | B-3 | 0.99 | 0.01 | 0.99 | 0.01 | 0.05 | 0.39 | 0.45 | 0.35 | 0.20 | 1.00 | 3.0 | 0.44 |
| | 19 | B-4 | 0.90 | 0.10 | 0.88 | 0.12 | 0.45 | 0.49 | 0.50 | 0.40 | 0.10 | 1.00 | 4.0 | 0.56 |
| | 20 | B-6 | 0.95 | 0.05 | 0.85 | 0.15 | 0.35 | 0.44 | 0.40 | 0.45 | 0.15 | 1.00 | 2.5 | 0.49 |

TABLE 18

| TYPE | | Cemented Carbide Substrate No. | Crystal Orientation Hysteresis Layer ((Ti, Al)NC layer) | | | | | | Hard Coating Layer ((Al, Ti, Si)N layer) | | | | | |
|---|---|---|---|---|---|---|---|---|---|---|---|---|---|---|
| | | | Designated Composition (atomic ratio) | | | | Designated Thickness (μm) | FWHM at (200) plane (degree) | Designated Composition (atomic ratio) | | | | Designated Thickness (μm) | FWHM at (200) plane (degree) |
| | | | Ti | Al | N | C | | | Al | Ti | Si | N | | |
| CONVENTIONAL | 1 | A-1 | — | — | — | — | — | — | 0.25 | 0.55 | 0.20 | 1.00 | 8.0 | 1.20 |
| CUTTING | 2 | A-2 | — | — | — | — | — | — | 0.50 | 0.35 | 0.15 | 1.00 | 2.0 | 1.00 |
| INSERT | 3 | A-3 | — | — | — | — | — | — | 0.40 | 0.50 | 0.10 | 1.00 | 7.5 | 0.93 |
| | 4 | A-4 | — | — | — | — | — | — | 0.45 | 0.50 | 0.05 | 1.00 | 4.0 | 1.35 |
| | 5 | A-5 | — | — | — | — | — | — | 0.45 | 0.35 | 0.20 | 1.00 | 3.5 | 0.95 |
| | 6 | A-6 | — | — | — | — | — | — | 0.30 | 0.55 | 0.15 | 1.00 | 7.0 | 1.00 |
| | 7 | A-7 | — | — | — | — | — | — | 0.40 | 0.50 | 0.10 | 1.00 | 10.0 | 1.50 |
| | 8 | A-8 | — | — | — | — | — | — | 0.60 | 0.35 | 0.05 | 1.00 | 3.5 | 1.00 |
| | 9 | A-9 | — | — | — | — | — | — | 0.45 | 0.40 | 0.15 | 1.00 | 8.0 | 1.35 |
| | 10 | A-10 | — | — | — | — | — | — | 0.45 | 0.45 | 0.10 | 1.00 | 4.5 | 0.97 |

TABLE 19

| TYPE | | Cemented Carbide Substrate No. | Crystal Orientation Hysteresis Layer ((Ti, Al)NC layer) | | | | | | Hard Coating Layer ((Al, Ti, Si)N layer) | | | | | |
|---|---|---|---|---|---|---|---|---|---|---|---|---|---|---|
| | | | Designated Composition (atomic ratio) | | | | Designated Thickness (μm) | FWHM at (200) plane (degree) | Designated Composition (atomic ratio) | | | | Designated Thickness (μm) | FWHM at (200) plane (degree) |
| | | | Ti | Al | N | C | | | Al | Ti | Si | N | | |
| CONVENTIONAL | 11 | B-1 | — | — | — | — | — | — | 0.40 | 0.55 | 0.05 | 1.00 | 5.0 | 0.96 |
| CUTTING | 12 | B-2 | — | — | — | — | — | — | 0.55 | 0.35 | 0.10 | 1.00 | 10.0 | 0.93 |
| INSERT | 13 | B-3 | — | — | — | — | — | — | 0.35 | 0.50 | 0.15 | 1.00 | 7.0 | 1.10 |
| | 14 | B-4 | — | — | — | — | — | — | 0.30 | 0.50 | 0.20 | 1.00 | 2.5 | 1.20 |
| | 15 | B-5 | — | — | — | — | — | — | 0.60 | 0.35 | 0.05 | 1.00 | 8.0 | 1.30 |
| | 16 | B-6 | — | — | — | — | — | — | 0.35 | 0.55 | 0.10 | 1.00 | 2.0 | 0.90 |
| | 17 | B-2 | — | — | — | — | — | — | 0.30 | 0.50 | 0.15 | 1.00 | 4.5 | 0.92 |
| | 18 | B-3 | — | — | — | — | — | — | 0.45 | 0.35 | 0.20 | 1.00 | 3.0 | 1.25 |
| | 19 | B-4 | — | — | — | — | — | — | 0.50 | 0.40 | 0.10 | 1.00 | 4.0 | 1.50 |
| | 20 | B-6 | — | — | — | — | — | — | 0.40 | 0.45 | 0.15 | 1.00 | 2.5 | 1.00 |

TABLE 20

| TYPE | | Flank Wear Width (mm) | | |
| --- | --- | --- | --- | --- |
| | | high-speed, continuous turning of alloyed steel | high-speed, interrupted turning of carbon steel | high-speed, interrupted turning of cast iron |
| CUTTING INSERT OF THE PRESENT INVENTION | 1 | 0.21 | 0.33 | 0.31 |
| | 2 | 0.25 | 0.26 | 0.29 |
| | 3 | 0.19 | 0.28 | 0.24 |
| | 4 | 0.28 | 0.25 | 0.23 |
| | 5 | 0.25 | 0.27 | 0.23 |
| | 6 | 0.22 | 0.26 | 0.26 |
| | 7 | 0.29 | 0.23 | 0.19 |
| | 8 | 0.31 | 0.28 | 0.22 |
| | 9 | 0.25 | 0.26 | 0.24 |
| | 10 | 0.33 | 0.25 | 0.28 |
| | 11 | 0.25 | 0.28 | 0.21 |
| | 12 | 0.20 | 0.26 | 0.22 |
| | 13 | 0.18 | 0.19 | 0.20 |
| | 14 | 0.24 | 0.28 | 0.26 |
| | 15 | 0.29 | 0.26 | 0.23 |
| | 16 | 0.25 | 0.19 | 0.25 |
| | 17 | 0.33 | 0.30 | 0.23 |
| | 18 | 0.21 | 0.23 | 0.26 |
| | 19 | 0.19 | 0.29 | 0.25 |
| | 20 | 0.26 | 0.31 | 0.24 |
| CONVENTIONAL CUTTING INSERT | 1 | 0.43 | 0.49 | 0.51 |
| | 2 | 0.39 | 0.51 | 0.38 |
| | 3 | 0.51 | 0.33 | 0.41 |
| | 4 | 0.40 | 0.41 | 0.46 |
| | 5 | 0.43 | 0.45 | 0.48 |
| | 6 | 0.43 | 0.39 | 0.45 |
| | 7 | 0.49 | 0.38 | 0.46 |
| | 8 | 0.55 | 0.35 | 0.51 |
| | 9 | 0.53 | 0.44 | 0.58 |
| | 10 | 0.48 | 0.46 | 0.33 |
| | 11 | 0.42 | 0.51 | 0.39 |
| | 12 | 0.52 | 0.43 | 0.45 |
| | 13 | 0.40 | 0.39 | 0.43 |
| | 14 | 0.53 | 0.48 | 0.49 |
| | 15 | 0.51 | 0.46 | 0.49 |
| | 16 | 0.49 | 0.44 | 0.47 |
| | 17 | 0.44 | 0.47 | 0.44 |
| | 18 | 0.55 | 0.49 | 0.51 |
| | 19 | 0.45 | 0.48 | 0.48 |
| | 20 | 0.56 | 0.51 | 0.55 |

EXAMPLE 5

Ingredient powders, i.e., middle coarse grain WC powder having 5.5 μm for the average particle diameter, fine WC powder having 0.8 μm for the average particle diameter, TaC powder having 1.3 μm for the average particle diameter, NbC powder—having 1.2 μm for the average particle diameter, ZrC powder having 1.2 μm for the average particle diameter, $Cr_3C_2$ powder having 2.3 μm for the average particle diameter, VC powder having 1.5 μm for the average particle diameter, (Ti, W)C powder having 1.0 μm for the average particle diameter, Co powder having 1.8 μm for the average particle diameter were prepared and mixed in accordance with compounding ratios as presented in TABLE 21. Furthermore, wax was added to the ingredient powders and these were mixed in acetone using a ball mill for 24 hours, dried under a reduced pressure, and were compacted under pressure of 100 MPa so as to form a green compact. The green compact was heated up to a predetermined temperature in a range from 1370 to 1470° C. at a rate of 7° C./min. under a pressure of 6 Pa and held at this temperature for 1 hour so as to be sintered. After that, it was cooled in the condition of a furnace cooling so that a sintered compact was formed. In this way, three types of the sintered compact were made as round bars each having a diameter of 8 mm, 13 mm, and 26 mm, respectively, for making cemented carbide substrate. These three types of sintered compact as round bars were subjected further to a grinding work so that cemented carbide substrates (end mills) from "a" to "h" were made. Here, each substrate has dimensions, i.e., the diameter and the length, of the part of the cutting edge of 6 mm×13 mm, 10 mm×22 mm, and 20 mm×45 mm, were respectively, as presented in TABLE 21.

Next, these cemented carbide substrates (end mills) a-h were subjected to ultrasonic cleaning in an acetone solvent, were dried, and set in an ordinary arc ion plating apparatus as shown in FIG. 5, respectively. Then, the crystal orientation hysteresis layer (the (Ti, Al)NC layer) and the hard coating layer ((Al, Ti, Si)N layer) having the designated composition and thickness, which are presented in TABLE 22, were formed on the surface of the cemented carbide substrates by vapor deposition under the same condition as for Example 4, respectively. In this way, end mill made of cemented carbide with surface coating of the present invention 1–8 (hereinafter referred to as a coated cemented carbide end mill of the present invention) having a geometrical configuration as shown in FIG. 7A as a perspective view and in FIG. 7B as a cross-sectional view were manufactured as coated cemented carbide tools of the present invention.

Moreover, conventional end mills made of cemented carbide with surface coatings 1–8 (hereinafter referred as a conventional coated cemented carbide end mill) as conventional coated cemented carbide tools were made as control samples, as presented in TABLE 23, which are configured as with the end mills of the present invention excepting that the crystal orientation hysteresis layer ((Ti, Al)NC layer) is not formed.

Next, the coated cemented carbide end mills of the present invention 1–8 and the conventional coated cemented carbide end mills 1–8 were subjected to a high-speed, dry, slotting operation test. The detailed test conditions were set as follows:

for a test of high-speed, wet, slotting of tool steel using the coated cemented carbide end mills of the present invention 1–3 and the conventional coated cemented carbide end mills 1–3 (wherein water-miscible cutting fluid was applied);

workpiece: JIS-SKD61 plate (hardness: HRC40) having plane-size of 100 mm×250 mm and thickness of 50 mm;

cutting speed: 120 m/min.;

depth of the groove (depth of cutting): 1.3 mm;

table-feed: 700 mm/min.;

for a test of high-speed, wet, slottinn of stainless steel using the coated cemented carbide end mills of the present invention 4–6 and the conventional coated cemented carbide end mills 4–6;

workpiece: JIS-SUS304 plate having plane-size of 100 mm×250 mm and thickness of 50 mm;

cutting speed: 100 m/min.;

depth of the groove (depth of cutting): 10 mm;

table-feed: 500 mm/min.;

for a test of high-speed, wet, of carbon steel using the coated cemented carbide end mills of the present invention 7 and 8 and the conventional coated cemented carbide end mills 7 and 8 (wherein water-miscible cutting fluid was applied, respectively);

workpiece: JIS-S45C plate having plane-size of 100 mm×250 mm and thickness of 50 mm;
cutting speed: 125 m/min.;
depth of the groove (depth of cutting): 12 mm;
table-feed: 300 mm/min.

In all slotting tests, the cut groove length was measured; when the flank of the peripheral cutting edge is worn away by 0.2 mm, this is a guide for the end of the usual tool life. These results of the measurements are shown in TABLES 22 and 23, respectively.

TABLE 21

| TYPE | | Co | (Ti, W)C | TaC | NbC | ZrC | Cr$_3$C$_2$ | VC | WC | diameter × length of the cutting edge (mm) |
|---|---|---|---|---|---|---|---|---|---|---|
| CEMENTED CARBIDE SUBSTRATE (END MILL) | a | 8 | 5 | — | — | — | — | — | middle, coarse grain: balance | 6 × 13 |
| | b | 6 | — | 1 | 0.5 | — | — | — | fine grain: balance | 6 × 13 |
| | c | 8 | — | 1 | — | 1 | 0.5 | 0.5 | fine grain: balance | 6 × 13 |
| | d | 8 | — | — | — | — | 0.5 | 0.5 | fine grain: balance | 10 × 22 |
| | e | 9 | 25 | 10 | 1 | — | — | — | middle, coarse grain: balance | 10 × 22 |
| | f | 10 | — | — | — | — | 1 | — | fine grain: balance | 10 × 22 |
| | g | 12 | 17 | 9 | 1 | — | — | — | middle, coarse grain: balance | 20 × 45 |
| | h | 12 | — | 10 | 5 | 10 | — | — | middle, coarse grain: balance | 20 × 45 |

TABLE 22

| | | Cemented Carbide Substrate | Crystal Orientation Hysteresis Layer ((Ti, Al)NC layer) | | | | |
|---|---|---|---|---|---|---|---|
| | | | Designated Composition (atomic ratio) | | | | Designated Thickness | FWHM at (200) plane |
| TYPE | | No. | Ti | Al | N | C | (μm) | (degree) |
| END MILL OF THE PRESENT INVENTION | 1 | a | 0.85 | 0.15 | 0.99 | 0.01 | 0.50 | 0.40 |
| | 2 | b | 0.95 | 0.05 | 0.88 | 0.12 | 0.45 | 0.36 |
| | 3 | c | 0.99 | 0.01 | 0.92 | 0.08 | 0.05 | 0.51 |
| | 4 | d | 0.90 | 0.10 | 0.95 | 0.05 | 0.40 | 0.45 |
| | 5 | e | 0.95 | 0.05 | 0.85 | 0.15 | 0.25 | 0.48 |
| | 6 | f | 0.99 | 0.01 | 0.87 | 0.13 | 0.35 | 0.50 |
| | 7 | g | 0.85 | 0.15 | 0.90 | 0.10 | 0.15 | 0.33 |
| | 8 | h | 0.90 | 0.10 | 0.85 | 0.15 | 0.50 | 0.42 |

| | | Hard Coating Layer ((Al, Ti, Si)N layer) | | | | | | |
|---|---|---|---|---|---|---|---|---|
| | | Designated Composition (atomic ratio) | | | | Designated Thickness | FWHM at (200) plane | cutting length |
| TYPE | | Al | Ti | Si | N | (μm) | (degree) | (m) |
| END MILL OF THE PRESENT INVENTION | 1 | 0.25 | 0.55 | 0.20 | 1.00 | 2.0 | 0.48 | 630 |
| | 2 | 0.50 | 0.40 | 0.10 | 1.00 | 3.0 | 0.42 | 720 |
| | 3 | 0.60 | 0.35 | 0.05 | 1.00 | 5.5 | 0.58 | 700 |
| | 4 | 0.35 | 0.50 | 0.15 | 1.00 | 3.0 | 0.55 | 690 |
| | 5 | 0.45 | 0.45 | 0.10 | 1.00 | 7.0 | 0.53 | 600 |
| | 6 | 0.60 | 0.35 | 0.05 | 1.00 | 4.5 | 0.57 | 540 |
| | 7 | 0.40 | 0.50 | 0.10 | 1.00 | 10.0 | 0.40 | 530 |
| | 8 | 0.45 | 0.40 | 0.15 | 1.00 | 5.5 | 0.49 | 670 |

TABLE 23

| TYPE | Cemented Carbide Substrate No. | Crystal Orientation Hysteresis Layer ((Ti, Al)NC layer) | | | | | |
|---|---|---|---|---|---|---|---|
| | | Designated Composition (atomic ratio) | | | | Designated Thickness (μm) | FWHM at (200) plane (degree) |
| | | Ti | Al | N | C | | |
| CONVENTIONAL END MILL | 1 | a | — | — | — | — | — | — |
| | 2 | b | — | — | — | — | — | — |
| | 3 | c | — | — | — | — | — | — |
| | 4 | d | — | — | — | — | — | — |
| | 5 | e | — | — | — | — | — | — |
| | 6 | f | — | — | — | — | — | — |
| | 7 | g | — | — | — | — | — | — |
| | 8 | h | — | — | — | — | — | — |

| TYPE | | Hard Coating Layer ((Al, Ti, Si)N layer) | | | | | | |
|---|---|---|---|---|---|---|---|---|
| | | Designated Composition (atomic ratio) | | | | Designated Thickness (μm) | FWHM at (200) plane (degree) | cutting length (m) |
| | | Al | Ti | Si | N | | | |
| CONVENTIONAL END MILL | 1 | 0.25 | 0.55 | 0.20 | 1.00 | 2.0 | 1.20 | 270 |
| | 2 | 0.50 | 0.40 | 0.10 | 1.00 | 3.0 | 0.95 | 250 |
| | 3 | 0.60 | 0.35 | 0.05 | 1.00 | 5.5 | 1.35 | 360 |
| | 4 | 0.35 | 0.50 | 0.15 | 1.00 | 3.0 | 1.50 | 320 |
| | 5 | 0.45 | 0.45 | 0.10 | 1.00 | 7.0 | 1.55 | 300 |
| | 6 | 0.60 | 0.35 | 0.05 | 1.00 | 4.5 | 1.20 | 280 |
| | 7 | 0.40 | 0.50 | 0.10 | 1.00 | 10.0 | 0.90 | 320 |
| | 8 | 0.45 | 0.40 | 0.15 | 1.00 | 5.5 | 1.60 | 250 |

EXAMPLE 6

The three types of sintered round rod each having a diameter of 8 mm (for cemented carbide substrates a–c), 13 mm (for cemented carbide substrates d–f), and 26 mm (for cemented carbide substrates g, h), respectively, which were made through the process described in Example 5 were used again and further subjected to a grinding work so that cemented carbide substrates (twist drills) from "a'" to "h'" were made in which each substrate has dimensions, i.e., the diameter and the length, of 4 mm×13 mm (cemented carbide substrates a'–c'), 8 mm×22 mm (cemented carbide substrate d'–f'), and 16 mm×45 mm (cemented carbide substrates g', h'), respectively.

Next, these cemented carbide substrates (twist drills) a'–h' were subjected to a horning process and ultrasonic cleaning in an acetone solvent for the surface, were dried, and set in an ordinary arc ion plating apparatus as shown in FIG. 5, respectively. Then, the crystal orientation hysteresis layer (the (Ti, Al)NC layer) and the hard coating layer ((Al, Ti, Si)N layer) having the designated composition and thickness, which are presented in TABLE 24, were formed on the surface of the cemented carbide substrates by vapor deposition under the same condition as for Example 4, respectively. In this way; drills made of cemented carbide with surface coatings of the present invention 1–8 (hereinafter referred to as a coated cemented carbide drill of the present invention) having a geometrical configuration as shown in FIG. 8A as a perspective view and in FIG. 8B as a cross-sectional view were manufactured as coated cemented carbide tools of the present invention.

Moreover, conventional drills made of cemented carbide with surface coatings 1–8 (hereinafter referred as a conventional coated cemented carbide drill) as conventional coated cemented carbide tools were made as control samples, as presented in TABLE 25, which are configured as with the drills of the present invention excepting that the crystal orientation hysteresis layer ((Ti, Al)NC layer) is not formed.

Next, the coated cemented carbide drills of the present invention 1–8 and the conventional coated cemented carbide drills 1–8 were subjected to a high-speed, wet, drilling operation test in which a blind hole with 2.5 times the diameter of the drill-diameter was drilled. The detailed test conditions were set as follows:

for a test of high-speed, wet, drilling of alloyed steel using the coated cemented carbide drills of the present invention 1–3 and the conventional coated cemented carbide drills 1–3;
  workpiece: JIS-SCM440 plate having plane-size of 100 mm×250 mm and thickness of 50 mm;
  cutting speed: 100 m/min.;
  feed: 0.13 mm/rev.;

for a test of high-speed, wet, boring of carbon steel using the coated cemented carbide drills of the present invention 4–6 and the conventional coated cemented carbide drills 4–6;
  workpiece: JIS-S50C plate having plane-size of 100 mm×250 mm and thickness of 50 mm;
  cutting speed: 120 m/min.;
  feed: 0.16 mm/rev.;

for a test of high-speed, wet, cutting of stainless steel using the coated cemented carbide drills of the present invention 7 and 8 and the conventional coated cemented carbide drills 7 and 8;
  workpiece: JIS-SUS316 plate having plane-size of 100 mm×250 mm and thickness of 50 mm;
  cutting speed: 80 m/min.;
  feed: 0.15 mm/rev.;

In all high-speed, wet, drilling tests (wherein water-miscible cutting fluid was used), the numbers of drilled holes were measured when the flank wear width of the cutting edge came down to 0.3 mm. These results of the measurements are shown in TABLES 24 and 25, respectively.

on the coated cemented carbide inserts of the present invention 1–20, the coated cemented carbide end mills of the present invention 1–8 and the coated cemented carbide drills

TABLE 24

| TYPE | | Cemented Carbide Substrate No. | Crystal Orientation Hysteresis Layer ((Ti, Al)NC layer) | | | | Designated Thickness (μm) | FWHM at (200) plane (degree) |
|---|---|---|---|---|---|---|---|---|
| | | | Designated Composition (atomic ratio) | | | | | |
| | | | Ti | Al | N | C | | |
| DRILL | 1 | a' | 0.90 | 0.10 | 0.85 | 0.15 | 0.30 | 0.43 |
| OF THE | 2 | b' | 0.95 | 0.05 | 0.99 | 0.01 | 0.35 | 0.38 |
| PRESENT | 3 | c' | 0.85 | 0.15 | 0.95 | 0.05 | 0.50 | 0.45 |
| INVENTION | 4 | d' | 0.99 | 0.01 | 0.93 | 0.07 | 0.05 | 0.48 |
| | 5 | e' | 0.90 | 0.10 | 0.90 | 0.10 | 0.25 | 0.39 |
| | 6 | f' | 0.85 | 0.15 | 0.91 | 0.09 | 0.40 | 0.45 |
| | 7 | g' | 0.95 | 0.05 | 0.97 | 0.03 | 0.25 | 0.40 |
| | 8 | h' | 0.90 | 0.10 | 0.88 | 0.12 | 0.45 | 0.29 |

| TYPE | | Hard Coating Layer ((Al, Ti, Si)N layer) | | | | Designated Thickness (μm) | FWHM at (200) plane (degree) | number of holes |
|---|---|---|---|---|---|---|---|---|
| | | Designated Composition (atomic ratio) | | | | | | |
| | | Al | Ti | Si | N | | | |
| DRILL | 1 | 0.40 | 0.50 | 0.10 | 1.00 | 6.0 | 0.55 | 12500 |
| OF THE | 2 | 0.40 | 0.45 | 0.15 | 1.00 | 6.5 | 0.45 | 13000 |
| PRESENT | 3 | 0.25 | 0.55 | 0.20 | 1.00 | 5.5 | 0.50 | 13500 |
| INVENTION | 4 | 0.60 | 0.35 | 0.05 | 1.00 | 8.0 | 0.51 | 11050 |
| | 5 | 0.50 | 0.35 | 0.15 | 1.00 | 10.0 | 0.57 | 15000 |
| | 6 | 0.50 | 0.40 | 0.10 | 1.00 | 5.0 | 0.51 | 12500 |
| | 7 | 0.40 | 0.50 | 0.10 | 1.00 | 2.0 | 0.48 | 13800 |
| | 8 | 0.40 | 0.45 | 0.15 | 1.00 | 3.0 | 0.42 | 15200 |

TABLE 25

| TYPE | | Cemented Carbide Substrate No. | Crystal Orientation Hysteresis Layer ((Ti, Al)NC layer) | | | | Designated Thickness (μm) | FWHM at (200) plane (degree) |
|---|---|---|---|---|---|---|---|---|
| | | | Designated Composition (atomic ratio) | | | | | |
| | | | Ti | Al | N | C | | |
| CONVENTIONAL | 1 | a' | — | — | — | — | — | — |
| DRILL | 2 | b' | — | — | — | — | — | — |
| | 3 | c' | — | — | — | — | — | — |
| | 4 | d' | — | — | — | — | — | — |
| | 5 | e' | — | — | — | — | — | — |
| | 6 | f' | — | — | — | — | — | — |
| | 7 | g' | — | — | — | — | — | — |
| | 8 | h' | — | — | — | — | — | — |

| TYPE | | Hard Coating Layer ((Al, Ti, Si)N layer) | | | | Designated Thickness (μm) | FWHM at (200) plane (degree) | number of holes |
|---|---|---|---|---|---|---|---|---|
| | | Designated Composition (atomic ratio) | | | | | | |
| | | Al | Ti | Si | N | | | |
| CONVENTIONAL | 1 | 0.40 | 0.50 | 0.10 | 1.00 | 6.0 | 0.92 | 7500 |
| DRILL | 2 | 0.40 | 0.45 | 0.15 | 1.00 | 6.5 | 1.20 | 9000 |
| | 3 | 0.25 | 0.55 | 0.20 | 1.00 | 5.5 | 1.10 | 8500 |
| | 4 | 0.60 | 0.35 | 0.05 | 1.00 | 8.0 | 0.97 | 8000 |
| | 5 | 0.50 | 0.35 | 0.15 | 1.00 | 10.0 | 1.50 | 5500 |
| | 6 | 0.50 | 0.40 | 0.10 | 1.00 | 5.0 | 1.30 | 10000 |
| | 7 | 0.40 | 0.50 | 0.10 | 1.00 | 2.0 | 1.25 | 9000 |
| | 8 | 0.40 | 0.45 | 0.15 | 1.00 | 3.0 | 1.05 | 8500 |

Incidentally, the compositions of the above-mentioned layers, i.e., the crystal orientation hysteresis layer ((Ti, Al)NC layer) and the hard coating layer ((Al, Ti, Si)N layer) of the present invention 1–8 as the coated cemented carbide tools of the present invention, as well as the hard coating layer ((Al, Ti, Si)N layer) on the conventional coated cemented carbide inserts 1–20, the conventional coated cemented carbide end mills 1–8, and the conventional coated cemented carbide drills 1–8 as the conventional coated cemented carbide tools, were measured in the thickness direction at the center area by using Auger Electron Spectral analysis equipment. The results of these measurements indicated that the composition of the layers was substantially the same as the designated value.

Also, cross sectional measurements of the thickness of the layers formed on the coated cemented carbide tools of the present invention and the conventional coated cemented carbide tools were done by using a scanning electron microscope. Then, the average thickness (the average of 5 points measurements) was indicated with the same value substantially as the designated thickness.

Moreover, the layers formed on the coated cemented carbide tools of the present invention and the conventional coated cemented carbide tools were inspected at the face and/or the flank of the cutting edge by Cu K α radiation using an X-ray diffractometer. Through these inspections, FWHM of the peak at the (200) plane in the X-ray diffraction pattern was determined (here, when it was difficult to measure the tools itself, the sample pieces for measurement, which were set in the arc ion plating apparatus at the time of manufacturing the tools, were inspected and the X-ray diffraction pattern thereof was used to determine FWHM of the peak). These results are shown in TABLES 16–19 and TABLES 22–25.

The experimental results which are presented in TABLES 16–25 obviously show the following: The coated cemented carbide tool of the present invention on which the hard coating layer having a peak of a narrow FWHM at the (200) plane due to the existence of the crystal orientation hysteresis layer and so having excellent heat resistance (i.e., resistance to oxidation and hardness at high temperature) exhibits an excellent wear resistance even in cutting operations not only of steels but also of cast irons accompanied by high heat generation: This is because both of the increase of the heat resistance and the improvement of the adhesion between the hard coating layer and the cemented carbide substrate surface due to the C component in the crystal orientation hysteresis layer provide a synergetic effect; As opposed to this, with regard to the conventional coated cemented carbide tool in which the degree of crystallinity at the (200) plane of the hard coating layer is low, abrasion proceeds rapidly and the operating life reaches an end in a short time when it is used in high-speed cutting operation accompanied by high heat generation.

As described above, the coated cemented carbide tool according to the second embodiment also has excellent wear resistance even in high-speed cutting operations on various steels and cast irons, and exhibits outstanding ability for cutting so that it sufficiently meets the requirements that cutting apparatus should have high performance, and that cutting operations should be performed with less power, less energy and low cost.

The invention claimed is:

1. A coated cutting tool comprising a substrate selected from the group consisting of cemented tungsten carbide and cermet comprising TiCN,
  (a) a crystal orientation hysteresis layer comprising a carbonitride compound layer comprising aluminum, and
  (b) a hard coating layer comprising a layer of nitride compound comprising a well-defined crystal orientation, degree of crystallinity, or a combination thereof; wherein
  (a1) the carbonitride compound layer has an average thickness of 0.05 to 0.5 μm and comprises a Ti—Al carbonitride compound layer expressed by the composition formula $(Ti_{1-X}Al_X)(N_{1-Y}C_Y)$, wherein X ranges from 0.05 to 0.20 and Y ranges from 0.01 to 0.15 by atomic ratio; and
  (b1) the nitride compound layer has an average thickness of 2 to 15 μm and comprises a Ti—Al nitride compound layer expressed by the composition formula as $(Ti_{1-Z}Al_Z)N$, wherein Z ranges from 0.45 to 0.65 by atomic ratio;
  wherein the carbonitride compound layer and the hard coating layer are formed on the surface of the substrate by physical vapor deposition; and
  wherein the crystal orientation hysteresis layer is deposited between the surface of the substrate and the hard coating layer.

2. The coated cutting tool of claim 1, wherein: the Ti—Al nitride compound layer exhibits an X-ray diffraction pattern measured by the X-ray diffractometer with Cu K α radiation in which a peak of not more than 0.6 degrees FWHM in 2θ is found at a (200) plane.

3. The coated cutting tool of claim 1, wherein: the Ti—Al carbonitride compound layer exhibits an X-ray diffraction pattern measured by the X-ray diffractometer with Cu K α radiation in which a peak of not more than 0.6 degrees FWHM in 2θ is found at a (200) plane and the Ti—Al nitride compound layer exhibits an X-ray diffraction pattern measured by the X-ray diffractometer with Cu K α radiation in which a peak of not more than 0.6 degrees FWHM in 2θ is found at a (200) plane.

4. A coated cutting tool comprising a substrate selected from the group consisting of cemented tungsten carbide and cermet comprising TiCN,
  (a) a crystal orientation hysteresis layer comprising a carbonitride compound layer comprising aluminum, and
  (b) a hard coating layer comprising a layer of nitride compound comprising a well-defined crystal orientation, degree of crystallinity, or a combination thereof; wherein
  (a2) the carbonitride compound layer consists of a Ti—Al carbonitride compound layer expressed by the composition formula $(Ti_{1-X}Al_X)(N_{1-Y}C_Y)$, wherein X ranges from 0.01 to 0.15 and Y ranges from 0.01 to 0.15 by atomic ratio, has an average thickness of from 0.05 to 0.5 μm, and
  (b2) the nitride compound layer has an average thickness of 2 to 10 μm and comprises a Al—Ti—Si nitride compound layer expressed by the composition formula $(Al_{1-(A+B)}Ti_ASi_B)N$, wherein A ranges from 0.35 to 0.55 and B ranges from 0.05 to 0.20 by atomic ratio;
  wherein the carbonitride compound layer and the hard coating layer are formed on the surface of the substrate by physical vapor deposition; and
  wherein the crystal orientation hysteresis layer is deposited between the surface of the substrate and the hard coating layer.

5. The coated cutting tool of claim 4, wherein: the Al—Ti—Si nitride compound layer exhibits an X-ray diffraction pattern measured by the X-ray diffractometer with Cu K α radiation in which a peak of not more than 0.6 degrees FWHM in 2θ is found at a (200) plane.

6. The coated cutting tool of claim 4, wherein: the Ti—Al carbonitride compound layer exhibits an X-ray diffraction pattern measured by the X-ray diffractometer with Cu K α radiation in which a peak of not more than 0.6 degrees FWHM in 2θ is found at a (200) plane and the Al—Ti—Si nitride compound layer exhibits an X-ray diffraction pattern measured by the X-ray diffractometer with Cu K α radiation in which a peak of not more than 0.6 degrees FWHM in 2θ is found at a (200) plane.

* * * * *